(12) United States Patent
Stalford et al.

(10) Patent No.: US 7,095,295 B1
(45) Date of Patent: Aug. 22, 2006

(54) MULTI-TUNABLE MICROELECTROMECHANICAL SYSTEM (MEMS) RESONATORS

(75) Inventors: Harold L. Stalford, Norman, OK (US); Michael A. Butler, Andover, MA (US); W. Kent Schubert, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 632 days.

(21) Appl. No.: 10/443,951

(22) Filed: May 21, 2003

(51) Int. Cl.
*H03H 9/46* (2006.01)

(52) U.S. Cl. .................... 333/186; 333/187; 333/189; 333/193

(58) Field of Classification Search ............. 333/186, 333/193, 194, 187, 189
See application file for complete search history.

(56) References Cited

U.S. PATENT DOCUMENTS

| | | | |
|---|---|---|---|
| 4,502,029 A | * | 2/1985 | Reed .................... 333/203 |
| 4,568,895 A | * | 2/1986 | Reed .................... 333/203 |
| 5,162,691 A | * | 11/1992 | Mariani et al. ........... 310/321 |
| 5,491,604 A | | 2/1996 | Nguyen et al. |
| 5,640,133 A | | 6/1997 | MacDonald et al. |
| 5,729,075 A | | 3/1998 | Strain |
| 5,867,074 A | * | 2/1999 | Ogiso et al. ............. 333/193 |
| 5,955,932 A | | 9/1999 | Nguyen et al. |
| 6,223,601 B1 | * | 5/2001 | Harada et al. ............ 310/321 |
| 6,236,281 B1 | | 5/2001 | Nguyen et al. |
| 6,278,337 B1 | | 8/2001 | Chan et al. |
| 6,404,304 B1 | | 6/2002 | Kwon et al. |
| 6,624,726 B1 | * | 9/2003 | Niu et al. ................. 333/186 |
| 6,680,660 B1 | * | 1/2004 | Nguyen .................. 333/186 |
| 6,700,460 B1 | * | 3/2004 | Takamine ............... 333/186 |
| 6,707,351 B1 | * | 3/2004 | Gorrell .................. 333/186 |
| 6,710,680 B1 | * | 3/2004 | Niu et al. ................. 333/186 |
| 6,713,938 B1 | * | 3/2004 | Nguyen .................. 333/186 |

* cited by examiner

*Primary Examiner*—Michael Tokar
*Assistant Examiner*—Lam T. Mai
(74) *Attorney, Agent, or Firm*—Jagtiani & Guttag

(57) ABSTRACT

A method for tuning a vibratory device including a cantilevered resonator comprising the steps of increasing a voltage $V_0$ supplied to the vibratory device to thereby increase the bandwidth of the vibratory device; and keeping the resonant frequency of the vibratory device at substantially that natural frequency of the cantilevered resonator, wherein the vibratory device comprises: a capacitor including a movable plate and a fixed plate spaced from each other, the movable plate being part of the cantilevered resonator; a voltage source connected to the capacitor for providing voltage $V_0$ across the capacitor to produce an attractive force between movable plate and fixed plate; a circuit connecting the voltage source to the capacitor; and a load resistor in said circuit having a resistance $R_L$ satisfying the following equation:

$$\mu = \frac{\omega_0 c_0 R_L}{(1-\lambda)}$$

where: $\mu$ is at least 10; $\omega_0$ is the beam constant for the cantilevered resonator; $c_0$ is the capacitance for the capacitor; and $\lambda$ is the voltage dependent coupling parameter for voltage $V_0$.

25 Claims, 17 Drawing Sheets

MULTI-TUNABLE MICROELECTROMECHANICAL SYSTEM (MEMS) RESONATORS

GOVERNMENT INTEREST STATEMENT

The United States Government has rights in this invention pursuant to Contract No. DE-AC04-94AL85000 between the United States Department of Energy and the Sandia Corporation for the management and operation of Sandia National Laboratories.

BACKGROUND OF THE INVENTION

1. Field of the Invention

The present invention relates to a tunable MEMS resonator and a method for actively tuning a MEMS resonator.

2. Description of the Prior Art

Microelectromechnical systems (MEMS) are miniaturized devices that provide low power consumption, and high frequency and greater sensitivity. MEMS components may be etched from a single material, such as crystal silicon. Prior devices have incorporated the technology of MEMS to resonators.

However, prior MEMS resonators have several limitations. One limitation is that prior MEMS resonators may only have resonant frequency changed in one direction, i.e. an increase the resonant frequency, and do not have the capability to have resonant frequencies both increased and decreased from the natural resonant frequency. In addition, another limitation of prior MEMS resonators is that the bandwidth Q is inadvertently changed and reduced along with the change in resonant frequency. Prior MEMS resonators also have no capability to have the resonant frequency and bandwidth of the resonators independently tuned.

A characteristic problem of MEMS resonators is that resonant frequency and bandwidth, i.e. Q value, which are strongly set by the mechanical properties of the resonators require tuning in real environments. This problem limits the applicability of MEMS resonators.

SUMMARY OF THE INVENTION

It is therefore an object of the present invention to provide a MEMS resonator and a method for tuning a MEMS resonator having a capability to increase and decrease the resonant frequency from the natural resonant frequency.

It is a further object to provide a MEMS resonator and a method for tuning a MEMS resonator in which the bandwidth of the resonator may be controlled as the resonant frequency is increased.

It is yet another object to provide a MEMS resonator and a method for tuning a MEMS resonator in which the resonant frequency and bandwidth of the resonator may be independently tuned.

Finally, it is an object of the invention to provide a MEMS resonator and a method for tuning a MEMS resonator in which tuning may be performed in real time or on the fly.

According to a first broad aspect of the present invention, there is provided a method for tuning a vibratory device including a cantilevered resonator comprising the steps of increasing a voltage $V_0$ supplied to the vibratory device to thereby increase the bandwidth of the vibratory device; and keeping the resonant frequency of the vibratory device at substantially that natural frequency of the cantilevered resonator, wherein the vibratory device comprises: a capacitor including a movable plate and a fixed plate spaced from each other, the movable plate being part of the cantilevered resonator; a voltage source connected to the capacitor for providing voltage $V_0$ across the capacitor to produce an attractive force between movable plate and fixed plate; a circuit connecting the voltage source to the capacitor; and a load resistor in said circuit having a resistance $R_L$ satisfying the following equation:

$$\mu = \frac{\omega_0 c_0 R_L}{(1-\lambda)}$$

where: $\mu$ is at least 10; $\omega_0$ is the beam constant for the cantilevered resonator; $c_0$ is the capacitance for the capacitor; and $\lambda$, which is the voltage dependent coupling parameter for voltage $V_0$, is no more than 0.05.

According to a second broad aspect of the invention, there is provided a method for tuning a vibratory device including a cantilevered resonator comprising the steps of: increasing a voltage $V_0$ supplied to the vibratory device to thereby increase the bandwidth of the vibratory device; and simultaneously decreasing the resonant frequency of the vibratory device below the natural frequency of the cantilevered resonator, wherein the vibratory device comprises: a capacitor including a movable plate and a fixed plate spaced from each other, the movable plate being part of the cantilevered resonator; a voltage source connected to the capacitor for providing voltage $V_0$ across the capacitor to produce an attractive force between movable plate and fixed plate; a circuit connecting voltage source to the capacitor; and a load resistor in the circuit having a resistance $R_L$ satisfying the following equation:

$$\mu = \frac{\omega_0 c_0 R_L}{(1-\lambda)}$$

where: $\mu$ is no more than 0.1; $\omega_0$ is the beam constant for the cantilevered resonator; $c_0$ is the capacitance for the capacitor; and $\lambda$, which is the voltage dependent coupling parameter for voltage $V_0$, is no more than 0.05.

According to a third broad aspect of the invention, there is provided a method for tuning a vibratory device including a cantilevered resonator comprising the steps of: increasing a voltage $V_0$ supplied to the vibratory device to thereby increase the bandwidth of the vibratory device; and varying the resonant frequency of the vibratory device by adjusting the self-inductance L of an inducer of the vibratory device, wherein the vibratory device comprises: a capacitor including a movable plate and a fixed plate spaced from each other, the movable plate being part of the cantilevered resonator; a voltage source connected to the capacitor for providing voltage $V_0$ across the capacitor to produce an attractive force between movable plate and fixed plate; a circuit connecting the voltage source to the capacitor, the circuit including the inducer; and a load resistor in the circuit having a resistance $R_L$ satisfying the following equation:

$$\mu = \frac{\omega_0 c_0 R_L}{(1-\lambda)}$$

$$1 + \delta = \frac{\omega_0 c_0 (L\omega_0)}{(1-\lambda)}$$

where: $\mu$ is no more than 0.1; $\delta$ is no more than 0.1; $\omega_0$ is the beam constant for the cantilevered resonator; $c_0$ is the capacitance for the capacitor; and $\lambda$, which is the voltage dependent coupling parameter for voltage $V_0$, is no more than $0.05 * \mu$.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Figure 1:
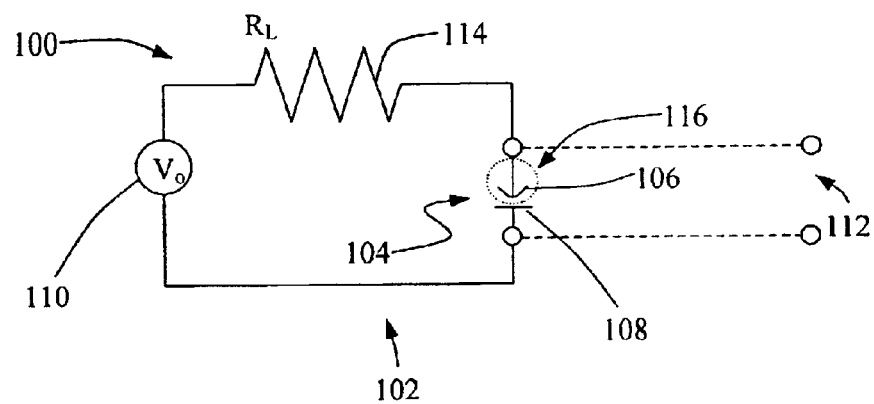
FIG. 1 illustrates a vibratory device constructed in accordance with an embodiment of the present invention.

It is advantageous to define several terms before describing the invention. It should be appreciated that the following definitions are used throughout this application.

Definitions

Where the definition of terms departs from the commonly used meaning of the term, Applicants intend to utilize the definitions provided below, unless specifically indicated.

For the purposes of the present invention, the term "vibratory device" refers to any mechanical structure having at least one mechanical element that is capable of vibrating. A vibratory device may have an electrical component. A preferred vibratory device is a MEMS resonator that includes an RC or LRC based circuit.

For the purposes of the present invention, the term "resonator" refers to any mechanical element that is vibrated. A resonator may include a cantilever beam, doubly clamped beams, membranes, comb drives, and simply supported beams.

For the purposes of the present invention, the term "cantilevered resonator" refers to any resonator that is cantilevered, i.e. includes one or more projecting structures supported at one end.

For the purposes of the present invention, the term "movable plate" refers to an electrode of a capacitor that moves in a direction towards or away from the other electrode, the fixed plate, of a capacitor when a voltage is applied across the capacitor. Preferably, the movable plate is substantially parallel with the fixed plate of a capacitor.

For the purposes of the present invention, the term "fixed plate" refers to an electrode of a capacitor that does not move when a voltage is supplied across a capacitor. Preferably, the fixed plate is substantially parallel with the movable plate of a capacitor.

For the purposes of the present invention, the term "beam constant" is defined by the following equation:

$$\omega_0 = \sqrt{K/m}$$

wherein: k is the spring constant of a cantilevered resonator and m is the mass of the cantilevered resonator.

For the purposes of the present invention, the term "voltage dependent coupling parameter" or $\lambda$ is defined by the following equation:

$$V_0^2 = \lambda(1-\lambda)^2 \frac{2kd_0^2}{c_0}$$

wherein: k is the beam constant of the cantilevered resonator of a vibratory device; $d_0$ is the distance between the movable plate and fixed plate a capacitor of a vibratory device of the present invention; and $c_0$ is the capacitance of the capacitor.

Description

Prior MEMS resonators applied a variable voltage to an electrode at the end of a cantilever beam to alter the vibration frequency of the beam, such as U.S. Pat. No. 5,729,075, the entire contents and disclosure of which are hereby incorporated by reference. The device described in the '075 patent uses voltage control to alter the natural resonant frequency of a MEMS so that a higher chosen vibration frequency of the MEMS may be achieved. Prior art devices have the limitation of snapping down electrostatically for large voltage amplitudes. Another limitation is that the prior art devices only change the resonant frequency in one direction (i.e., increase) and do not have the capability to both increase and decrease the resonant frequency in changes from the natural mechanical resonant frequency of the devices. In addition, another limitation is that prior MEMs resonators have no control over bandwidth as the resonant frequency is increased. Prior MEMS resonators have no capability to tune independently the resonant frequency and the bandwidth. Prior MEMS resonators have has no capability to change the resonant frequency in both directions.

A method for tuning MEMS resonators of the present invention overcome these prior limitations by tuning the bandwidth of a MEMS resonator by an increase of more than an order of magnitude, i.e. the MEMS resonator's Q is reduced proportionally with the increase in the bandwidth BW, while the MEMS resonator's resonant frequency is independently tuned up or down by several percent to match a selected vibration frequency.

One advantage of the device of the present invention is the ability to precisely select resonant frequency and bandwidth. Preferably, a method for turning MEMS resonators of the present invention may correct for manufacturing variations in the MEMS resonator, as well as tune MEMS resonators on the "fly" or in real time as needed in by the field applications. Preferably, the tuning on the fly may be accomplished by adjusting to changing circumstances of the MEMS resonator.

A method for turning MEMS resonators of the present invention may provide the ability to tune separately bandwidth and resonant frequency of a MEMS resonator. The capability to tune both separately and on the "fly" is significant. For example, this capability is essential to perform acoustic spectrum analysis and voice recognition where an integrated array of MEMS resonators are to cover individually designated regions of the voice spectrum. This capability of being able to tune both bandwidth and resonant frequency independently increases the applicability of MEMS resonators in various applications.

A method of the present invention provides for making MEMS resonators electrically tunable in resonant frequency and bandwidth. A preferred method may correct for manufacturing variations on the MEMS resonator and may allows for active tuning. A method of the present invention may solve the problem of constructing MEMS resonators that are tunable to increased bandwidth, i.e. lower Q value, and that are tunable in resonant frequency. In addition, A method of the present invention may solve the problem of constructing an array of MEMS resonators that covers a large wide-band frequency spectrum such that each individual resonator is tunable to a particular narrow-band frequency bandwidth and resonant frequency.

A preferred MEMS resonator of the present invention that may have cantilever beams, doubly clamped beams, membranes, comb drives, and simply supported beams that are mechanical resonators in which the mechanical element comprises a movable plate of a capacitor structure that could be used to pull on the mechanical resonator element in a controlled way so as to vary independently the MEMS resonator's resonant frequency and bandwidth.

Generally, a RC or a LRC capacitor-based circuit provides a feedback control system that couples with the dynamics of the mechanical resonator for tuning the bandwidth and resonant frequency response of a cantilevered resonator. Preferably, a capacitor-based circuit may be part of the vibratory device of the present invention.

FIG. 1 shows a vibratory device 100 constructed in accordance with an embodiment of the present invention. Vibratory device 100 includes a circuit 102 having a capacitor 104 including a cantilevered mechanical element 106, i.e. movable plate and an electrode 108, i.e. fixed plate, located $d_0$ microns below mechanical element 106. A voltage source 110 ($V_0$) is used to create a voltage 112 ($V_c$) across capacitor 104. Voltage 112 ($V_c$) produces an attractive force between mechanical element 106 and electrode 108, and, at equilibrium, causes mechanical element 106 to move closer to electrode 108 by an amount equal to $-\lambda d_0$. Where $V_0$ and $\lambda$ satisfy a relationship that depends on effective spring constant, k, of mechanical beam, the initial distance $d_0$, and the initial capacitance $c_0$ across mechanical element 106 and electrode 108. Initial distance $d_0$ is the distance between the parallel-plate condenser, i.e. the distance between the movable plate and fixed plate. Non-dimensional parameter $\lambda$ is a non-linear function of $V_0$ and is single valued. Preferably when employing the method of the present invention, the non-dimensional parameter $\lambda$ is more convenient to use instead of the voltage source $V_0$.

A load resistor 114 ($R_L$) in circuit 102 provides a loss mechanism for increasing the bandwidth of a MEMS resonator 116. Preferably when employing the method of the present invention, the non-dimensional parameter $\mu$, which is the product of $R_L$, the natural frequency $\omega_0(\omega_0=2\pi f_0)$ of MEMS resonator 116, and initial capacitance $c_0$, is convenient to use. Original resonant frequency is designated as $f_0$. Original bandwidth of mechanical resonator 116 is designated as $BW_0$.

A vibratory device having capacitor-based circuit with load resistor $R_L$ and voltage source $V_0$ is used to tune the bandwidth of a micro-mechanical resonator. The tuning is best modeled in terms of two non-dimensional parameters $\lambda$ and $\mu$ that depend on $R_L$ and $V_0$. The voltage source $V_0$ causes the cantilevered resonator to deflect to a new equilibrium position by an amount equal to $\lambda d_0$. The relationship between $V_0$ and $\lambda$ is given as shown in equation 1:

$$V_0^2 = \lambda(1-\lambda)^2 \frac{2kd_0^2}{c_0} \qquad (1)$$

The quantity μ is defined as shown in equation 2:

$$\mu = \frac{R_L \omega_0 c_0}{1-\lambda} \quad (2)$$

where: μ is no more than 0.1; and $\omega_0$ is the beam constant for the cantilevered resonator; and λ is no more than 0.05.

A method of the present invention for tuning MEMS resonators may have the following tuning trends. For small values of λ and μ, the bandwidth BW increases by $2\lambda\mu f_0$ and the resonant frequency f* decreases by the factor (1−λ) as shown in equation 3 and equation 4:

$$BW \cong BW_0 + 2\lambda\mu f_0 \quad (3)$$

$$f^* \cong f_0(1-\lambda) \quad (4)$$

$BW_0$ and $f_0$ are the bandwidth and resonant frequency, respectively, of a micromechanical resonator before a cantilevered resonator is coupled with the vibratory device having a capacitor-based circuit.

In one embodiment of the present invention there is provided a method for tuning a vibratory device including a cantilevered resonator comprising the steps of increasing a voltage $V_0$ supplied to the vibratory device to thereby increase the bandwidth of the vibratory device; and keeping the resonant frequency of the vibratory device at substantially that natural frequency of the cantilevered resonator, wherein the vibratory device comprises: a capacitor including a movable plate and a fixed plate spaced from each other, the movable plate being part of the cantilevered resonator; a voltage source connected to the capacitor for providing voltage $V_0$ across the capacitor to produce an attractive force between movable plate and fixed plate; a circuit connecting the voltage source to the capacitor; and a load resistor in said circuit having a resistance $R_L$ satisfying equation 2, where μ is at least 10.

Figure 2:
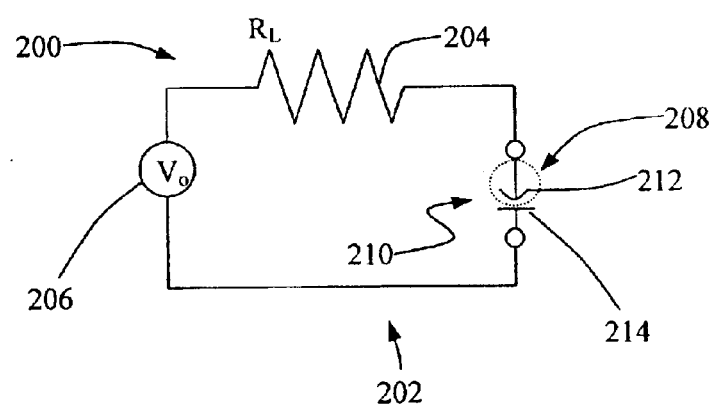
FIG. 2 illustrates a vibratory device constructed in accordance with another embodiment of the present invention.

A preferred MEMS resonator configuration that may allow for an increase in bandwidth of a MEMS resonator, while keeping the MEMS resonator's resonant frequency nearly fixed at the natural frequency of the mechanical resonator. FIG. 2, shows a vibratory device 200 of the present invention including circuit 202 with load resistor 204 ($R_L$) and voltage source 206 ($V_0$) is coupled with a mechanical resonator 208. Circuit 202 includes capacitor 210 having a cantilevered mechanical element 212, i.e. movable plate and an electrode 214, i.e. fixed plate, located $d_0$ microns below mechanical element 212. Load resistor 204 is selected so that the desired bandwidth is obtained and so that the non-dimensional parameter μ is much greater than unity. Resonant frequency f* and the new bandwidth BW approximately satisfy the relationship as shown in equation 5 and equation 6, respectively:

$$f^* = f_0\left(1 - \frac{\lambda}{\mu^2}\right) \quad (5)$$

$$BW = BW_0 + \left(\frac{2\lambda f_0}{\mu}\right) \quad (6)$$

For values of μ near 10, λ can be varied by means of the voltage source $V_0$ to increase significantly the bandwidth BW. For the case that $f_0$ is approximately 50 KHz, BW is increased by a factor up to 50 or more while keeping the resonant frequency f* within a hundredth of a percent of the natural frequency $f_0$ of the beam. By increasing the bandwidth BW, the Q is reduced proportionally.

In another embodiment of the present invention there is provided a method for tuning a vibratory device including a cantilevered resonator comprising the steps of: increasing a voltage $V_0$ supplied to the vibratory device to thereby increase the bandwidth of the vibratory device; and simultaneously decreasing the resonant frequency of the vibratory device below the natural frequency of the cantilevered resonator, wherein the vibratory device comprises: a capacitor including a movable plate and a fixed plate spaced from each other, the movable plate being part of the cantilevered resonator; a voltage source connected to the capacitor for providing voltage $V_0$ across the capacitor to produce an attractive force between movable plate and fixed plate; a circuit connecting voltage source to the capacitor; and a load resistor in the circuit having a resistance $R_L$ satisfying equation 2, where: μ is no more than 0.1.

Figure 3:
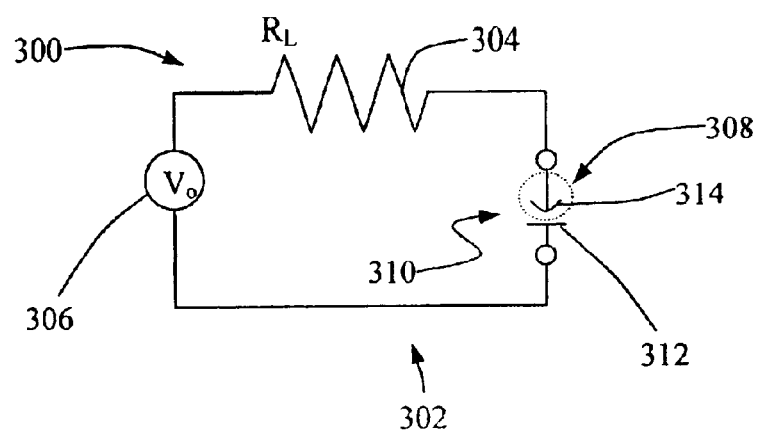
FIG. 3 illustrates a vibratory device constructed in accordance with another embodiment of the present invention.

A preferred MEMS resonator configuration may allow for an increase of the bandwidth of the MEMS resonator and, at the same time, decrease resonant frequency below the natural frequency of the mechanical resonator. FIG. 3 shows a vibratory device 300 constructed in accordance with another embodiment of the present invention having a circuit 302 with load resistor 304 ($R_L$) and voltage source 306 ($V_0$) is coupled with a mechanical resonator 308. Circuit 302 includes capacitor 310 having a cantilevered mechanical element 312, i.e. movable plate and an electrode 314, i.e. fixed plate, located $d_0$ microns below mechanical element 312. Load resistor 304 is selected so that the desired bandwidth is obtained and so that the non-dimensional parameter μ is much less than unity. Resonant frequency f and the new bandwidth BW approximately satisfy the relationship as shown in equation 7 and equation 8, respectively:

$$f^* = f_0(1-\lambda) \quad (7)$$

$$BW = BW_0 + 2\lambda f_0 \mu \quad (8)$$

For values of μ near 0.1, λ can be varied by means of the voltage source $V_0$ to increase significantly the bandwidth BW. For the case that $f_0$ is approximately 50 KHz, BW is increased by a factor up to 50 or more while, at the same time, decreasing the resonant frequency f* by several percent of the natural frequency $f_0$ of the beam. By increasing the bandwidth BW, the Q is reduced proportionally.

In another embodiment of the present invention, there is provided a method for tuning a vibratory device including a cantilevered resonator in which a voltage $V_0$ supplied to the vibratory device is increased to thereby increase the bandwidth of the vibratory device and the resonant frequency of the vibratory device is varied by adjusting the self-inductance L of an inducer of the vibratory device. Similar to the embodiments of the present invention described above, in this embodiment the vibratory device includes a capacitor having a movable plate and a fixed plate spaced from each other. The movable plate is part of the cantilevered resonator. A voltage source is connected to the capacitor for providing voltage $V_0$ across the capacitor to produce an attractive force between the movable plate and the fixed plate. A circuit connects the voltage source to the capacitor and the circuit includes the inducer and a load resistor having a resistance $R_L$ satisfying equation 2 above where: μ is no more than 0.1.

Figure 4:
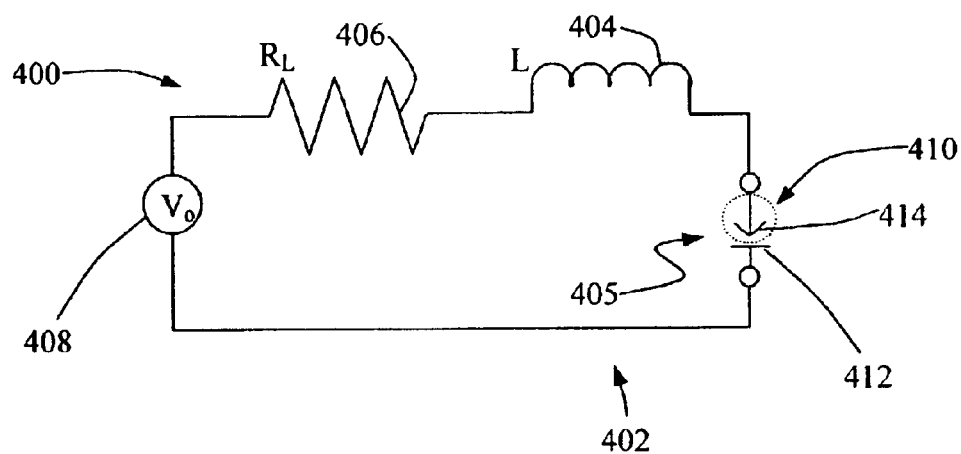
FIG. 4 illustrates a vibratory device having an inducer constructed in accordance with an embodiment of the present invention.

A preferred MEMS resonator configuration may allow for an increase of bandwidth of the MEMS resonator while having, at the same time, providing a means to the control to the increase, decrease, or keep fixed the MEMS resonator's resonant frequency as compared to the natural frequency of the mechanical resonator. FIG. 4 shows a vibratory device 400 constructed in accordance with an embodiment of the present invention having a capacitor-based system 402 with self-inductance (L) 404, capacitor 405, load resistor 406 ($R_L$) and voltage source 408 ($V_O$) is coupled with mechanical resonator 410. Capacitor 405 has a cantilevered mechanical element 412, i.e. movable plate and an electrode 414, i.e. fixed plate, located $d_0$ microns below mechanical element 412. A new non-dimensional parameter γ is introduced that depends on the value of L, where γ equal the product of L·$c_0$ and the square of $w_0$. Load resistor 406 and voltage source 408 are varied in relation to each other so that the ratio λ/μ is much less than unity. The value of L is varied so that the absolute value of γ−1 is less than μ. Resonant frequency f* and the new bandwidth BW approximately satisfy the relationships as shown in equation 9 and equation 10, respectively:

$$f^* = f_0\left(1 - \lambda\left(\frac{\gamma - 1}{\mu^2 + (1-\gamma)^2}\right)\right) \quad (9)$$

$$BW = BW_0 + 2\lambda f_0 \frac{\mu}{\mu^2 + (1-\gamma)^2} \quad (10)$$

For values of μ near 0.1, λ can be varied by means of the voltage source $V_O$ to increase significantly the bandwidth BW. For the case that $f_0$ is approximately 50 KHz, BW is increased by a factor up to 50 or more while, at the same time, the resonant frequency f* can be increased, decreased, or kept fixed by varying L. By increasing the bandwidth BW, the Q is reduced proportionally.

Methods for tuning MEMS resonator of the present invention may be used in a variety of applications, such as mechanical filters, accelerometers, pressure sensors, surface acoustic wave (SAW) devices, vibrating wire gauges, density sensors, liquid level sensors, viscosity sensors, flow meters, bulk quartz resonator sensors, resonator gate transistor, bulk quartz resonator sensors, quartz pressure sensors and accelerometers, vibrating wire gauges, density sensors, liquid level sensors, viscosity sensors, flow meters, frequency filters, resonator gate transistors, etc. Methods for tuning MEMS resonator of the present invention that are tunable in both bandwidth and resonant frequency may find many potential applications that require as a system resonator detector that needs to cover a sub-region of a frequency spectrum. Methods for tuning MEMS resonator of the present invention have applications to MEMS sensors that utilize cantilever beams, doubly clamped beams, membranes, comb drives, simply supported beams, etc. Methods for tuning MEMS resonator of the present invention have applications as mechanical resonators, where a mechanical element comprises one plate of a capacitor structure that could be used to pull on a mechanical resonator element in a controlled way to vary the resonant frequency and bandwidth of the mechanical resonator element. In addition, MEMS resonators of the present invention may have applications as a microfabricated acoustic spectrum analyzer that will incorporate various applications of the present invention.

EXAMPLE 1

Figure 5:
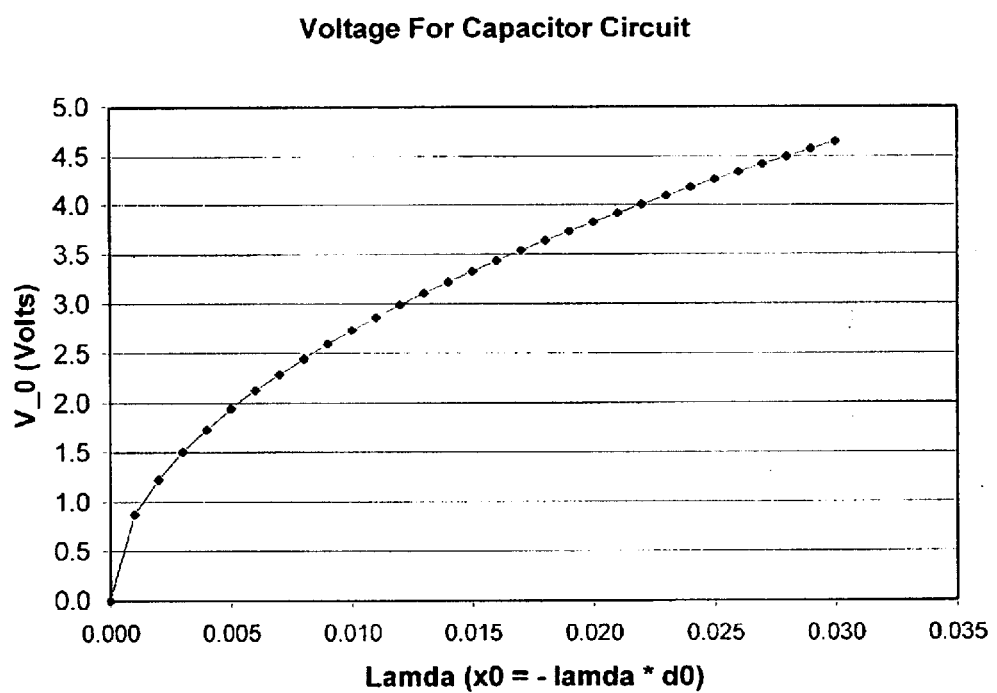
FIG. 5 is a graph of the relationship between $V_0$ and $\lambda$ for a vibratory device constructed in accordance with an embodiment of the present invention.
Figure 6:
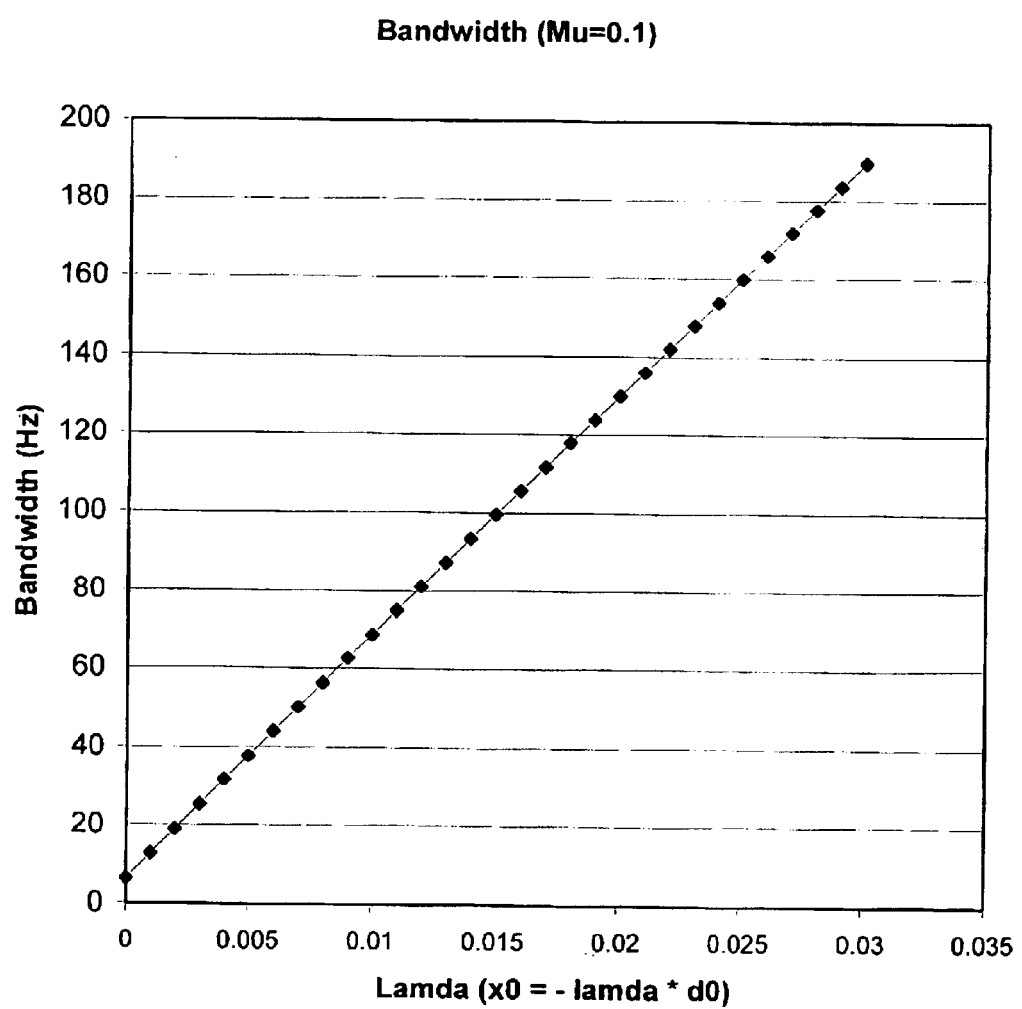
FIG. 6 is a graph of the relationship between BW and $\lambda$ for a vibratory device constructed in accordance with an embodiment of the present invention.
Figure 7:
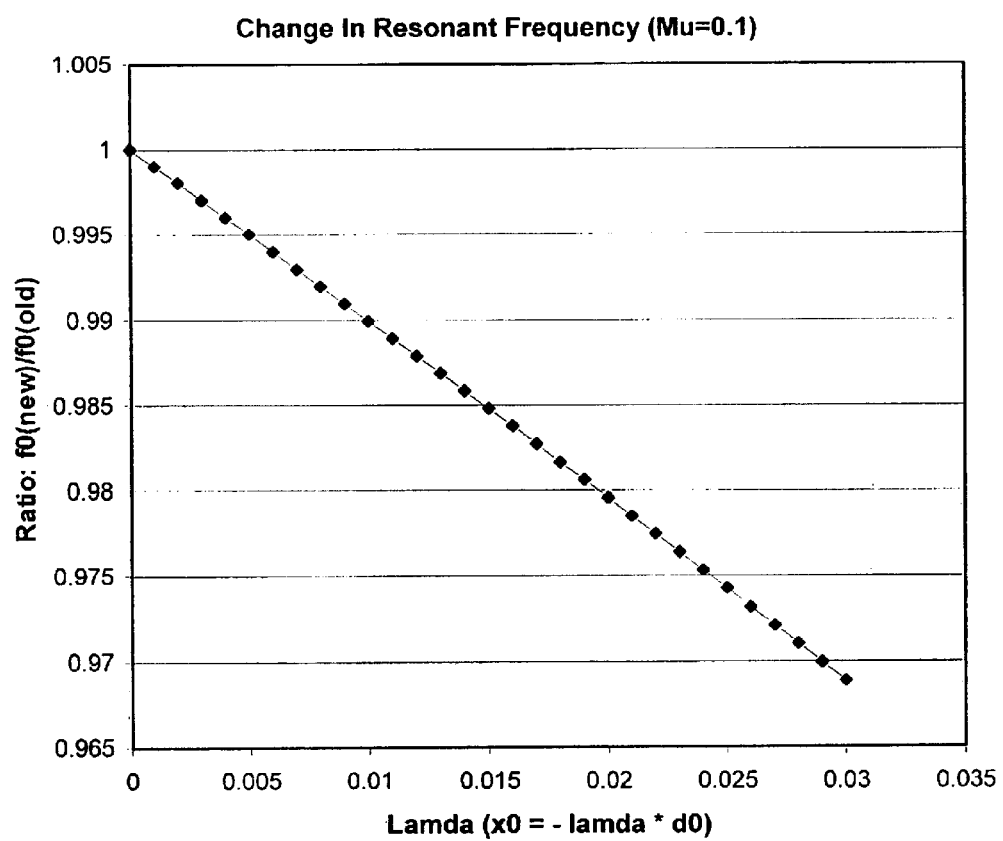
FIG. 7 is a graph of the relationship between a change in resonant frequent and $\lambda$ for a vibratory device constructed in accordance with an embodiment of the present invention.

Using the parameters set forth in Table 1 and Table 2, the following tuning trends for BW and f* are shown in FIGS. 5–7. The value of $R_L$ in equation 2 is defined so that μ=0.1.

TABLE 1

Micro-Mechanical Beam System

| Description of Parameters | Values of the Parameters |
|---|---|
| Length of Beam | L = 450 microns |
| Width of Beam | b = 40 microns |
| Thickness of Beam | h = 2 microns |
| Density of Polysilicon Material | ρ = 2.33e + 03 Kg/$m^3$ |
| Volume of Beam | Lbh = 3.6e − 14 $m^3$ |
| Mass of Beam | m = 8.388e − 11 Kg |
| Young's Modulus | E = 1.60e + 11 Newtons/$m^2$ |
| Beam Elastic "spring" Constant | k = 3.37 Newtons/m |
| Beam $\sqrt{k/m}$ Constant | $\omega_0$ = $\sqrt{k/m}$ = 200,476 rad/sec |
| Resonant Frequency of Beam | $f_0$ = $\omega_0/2\pi$ = 31,906.8 Hz |
| Mechanical Damping Constant | ζ = 0.0001 |

TABLE 2

Capacitor-Based Circuit

| Description of Parameters | Values of the Parameters |
|---|---|
| Capacitor Area (200 microns × 40 microns) | A = 8.0e − 09 $m^2$ |
| Permittivity of Free Space | $\epsilon_0$ = 8.854e − 12 farad/m |
| Distance Between Parallel-Plate Condenser | $d_0$ = 2 microns |
| Capacitance for Parallel-Plates @ $d_0$ | $c_0$ = $\epsilon_0 A/d_0$ = 3.54e − 14 farad |
| Resistor for Capacitor-Based Circuit | $R_L$(selected − values − in − ohms), based on value of μ. |
| Non-dimensional Parameter- μ (Based on Coupled System) | $\mu = \frac{R_L \omega_0 c_0}{1-\lambda}$, set to 0.1 |
| Non-dimensional Parameter- λ (Based on Coupled System) | $V_0^2 = \lambda(1-\lambda)^2 \frac{2kd_0^2}{c_0}$, $0 \leq \lambda \leq 0.03$ |

FIG. 5 is a graph of the relationship between $V_O$ and λ for a vibratory device constructed in accordance with an embodiment of the present invention.

FIG. 6 is a graph of the relationship between BW and λ for a vibratory device constructed in accordance with an embodiment of the present invention. Bandwidth BW increases up to 30 times for small values of λ (μ=0.1).

FIG. 7 is a graph of the relationship between a change in resonant frequent and λ for a vibratory device constructed in accordance with an embodiment of the present invention. Resonant frequency f* decreases 1–3% for small values of λ (μ=0.1).

Model of Capacitor-Based Circuit with Load Resistor $R_L$ and Voltage Source $V_O$ A capacitor may be modeled by the function C(x):

$$C(x) = \frac{\varepsilon A}{d(x)} = c_0 \frac{d_0}{d_0 + x}; c_0 = \frac{\varepsilon A}{d_0}; d(x) = d_0 + x \quad (11)$$

Voltage $V_c$ across capacitor is determined by the following equation:

$$V_c = \frac{q}{C(x)} \quad (12)$$

Force $F_c$ due to movable-plate capacitor (attractive force between plates):

Electrical energy function $E(x)$ is as follows:

$$E(x) = \frac{1}{2}\frac{q^2}{C(x)} = \frac{1}{2}C(x)V_c^2 \tag{13}$$

Force $F_c$ may be determined by the following equation:

$$F_c = -\frac{\partial}{\partial x}E(x) = -\frac{q^2}{2}\frac{\partial}{\partial x}\left(\frac{1}{C(x)}\right) = -\frac{q^2}{2c_0 d_0} \tag{14}$$

For a Capacitor-Based Circuit with Load Resistor $R_L$ and Voltage Source $V_0$:

$$V_c + iR_L = V_0 \tag{15}$$

$$\frac{q}{C(x)} + \frac{dq}{dt}R_L = V_0; \; i = \frac{dq}{dt} \tag{16}$$

Equivalent mechanical resonator systems acted on by Lorentz forcer $F_{Lorentz}$ and "capacitance" force $F_c$ may be modeled by the following equations:

$$m\ddot{x} + c\dot{x} + kx = F_{Lorentz} + F_c \tag{17}$$

$$\ddot{x} + \frac{c}{m}\dot{x} + \frac{k}{m}x = \frac{F_{Lorentz}}{m} + \frac{F_c}{m} \tag{18}$$

$$\ddot{x} + 2\varsigma\omega_0\dot{x} + \omega_0^2 x = \frac{F_{Lorentz}}{m} + \frac{F_c}{m}; \; \frac{c}{m} = 2\varsigma\omega_0; \; \frac{k}{m} = \omega_0^2 \tag{19}$$

$$\frac{\ddot{x}}{\omega_0^2} + 2\varsigma\frac{\dot{x}}{\omega_0} + x = \frac{F_{Lorentz}}{k} + \frac{F_c}{k}; \tag{20}$$

Coupled Mechanical Resonator/Capacitor-Based Circuit System acted on by Lorentz force $F_{Lorentz}$ may be modeled by the following equations:

$$\frac{\ddot{x}}{\omega_0^2} + 2\varsigma\frac{\dot{x}}{\omega_0} + x + \frac{q^2}{2c_0 d_0 k} = \frac{F_{Lorentz}}{k}; \tag{21}$$

$$\frac{q}{C(x)} + \dot{q}R_L = V_0; \tag{22}$$

Equilibrium Point $(x_0, q_0)$ for Coupled Mechanical Resonator/Capacitor-Based Circuit: From equation 21 and equation 22, the equation for equilibrium is found:

$$x_0 + \frac{q_0^2}{2c_0 d_0 k} = 0; \tag{23}$$

$$\frac{q_0}{C(x_0)} = V_0; \tag{24}$$

This model defines $x_0$ in terms of $\lambda$ as follows:

$$x_0 = -\lambda d_0; \tag{25}$$

Solving equation 23 and 24 for $V_0$ in terms of $\lambda$ this model produces the following result:

$$V_0^2 = \lambda(1-\lambda)^2 \frac{2kd_0^2}{c_0}; \tag{26}$$

From equation 26 this model shows that the maximum value of $V_0^2$ is achieved when $\lambda = \frac{1}{3}$. Equilibrium is only achieved for $0 \leq x \leq \frac{1}{3}$.

$$(V_0^2)_{max} = \frac{8kd_0^2}{27c_0}; \tag{27}$$

In terms of $\lambda$, $q_0$ is given by $$q_0 = d_0\sqrt{2\lambda kc_0}; \tag{28}$$

Linearized Equations of Motion about Equilibrium Point $(x_0, q_0)$ for Coupled Mechanical Resonator/Capacitor-Based Circuit:

This model defines linearized variables $\Delta x$ and $\Delta q$:

$$\Delta x = x - x_0; \tag{29}$$

$$\Delta q = q - q_0; \tag{30}$$

Linearizing equation 21 and equation 22, results in the following:

$$\frac{\Delta \ddot{x}}{\omega_0^2} + 2\varsigma\frac{\Delta \dot{x}}{\omega_0} + \Delta x + \frac{q_0}{c_0 d_0 k}\Delta q = \frac{F_{Lorentz}}{k}; \tag{31}$$

$$R_L\frac{\Delta \dot{q}}{\omega_0} + \frac{(1-\lambda)}{\omega_0 c_0}\Delta q + \frac{q_0}{\omega_0 c_0 d_0}\Delta x = 0; \tag{32}$$

Equation 31 and equation 32 may be rewritten as equations 33 and 34, respectively:

$$\frac{\Delta \ddot{x}}{\omega_0^2} + 2\varsigma\frac{\Delta \dot{x}}{\omega_0} + \Delta x + \frac{\sqrt{(2\lambda kc_0)}}{c_0 k}\Delta q = \frac{F_{Lorentz}}{k}; \tag{33}$$

$$\frac{\Delta \dot{q}}{\omega_0} + \frac{(1-\lambda)}{R_L\omega_0 c_0}\Delta q + \frac{\sqrt{(2\lambda kc_0)}}{R_L\omega_0 c_0}\Delta x = 0; \tag{34}$$

Using Laplace Transforms, equation 33 and equation 34 may be rewritten as equations 35 and 36, respectively:

$$\frac{s^2}{\omega_0^2}\Delta x(s) + 2\varsigma\frac{s}{\omega_0}\Delta x(s) + \Delta x(s) + \frac{\sqrt{(2\lambda kc_0)}}{c_0 k}\Delta q(s) = \frac{F_{Lorentz}(s)}{k}; \tag{35}$$

$$\frac{s}{\omega_0}\Delta q(s) + \frac{(1-\lambda)}{R_L\omega_0 c_0}\Delta q(s) + \frac{\sqrt{(2\lambda kc_0)}}{R_L\omega_0 c_0}\Delta x(s) = 0; \tag{36}$$

This model uses the following definitions:

$$R_L^* = \frac{(1-\lambda)}{\omega_0 c_0}; \tag{37}$$

$$\mu = \frac{R_L}{R_L^*}; \tag{38}$$

Equation 36 can be rewritten as:

$$\frac{s}{\omega_0}\Delta q(s) + \frac{1}{\mu}\Delta q(s) + \frac{1}{\mu}\frac{\sqrt{(2\lambda kc_0)}}{(1-\lambda)}\Delta x(s) = 0; \quad (39)$$

Equation 39 can be rewritten as follows:

$$\left(\frac{s}{\omega_0} + \frac{1}{\mu}\right)\Delta q(s) + \frac{1}{\mu}\frac{\sqrt{(2\lambda kc_0)}}{(1-\lambda)}\Delta x(s) = 0; \quad (40)$$

$$\left(\frac{s}{\omega_0} + \frac{1}{\mu}\right)\frac{\sqrt{(2\lambda kc_0)}}{c_0 k}\Delta q(s) + \frac{2\lambda}{\mu(1-\lambda)}\Delta x(s) = 0; \quad (41)$$

This model substitutes equation 40 into equation 36 to result in the following equation:

$$\frac{s^2}{\omega_0^2}\Delta x(s) + 2\varsigma\frac{s}{\omega_0}\Delta x(s) + \Delta x(s) - \left[\frac{1}{\left(\frac{s}{\omega_0}+\frac{1}{\mu}\right)}\right]\frac{2\lambda}{\mu(1-\lambda)}\Delta x(s) = \frac{F_{Lorentz}(s)}{k}; \quad (42)$$

This models lets:

$$s = j\omega; \quad (43)$$

and then defines the ratio:

$$r = \frac{\omega}{\omega_0}; \quad (44)$$

Substitution of equation 43 and equation 44 into equation 42 gives:

$$\left[1 - r^2 + 2\varsigma jr - \left[\frac{1-jr\mu}{1+r^2\mu^2}\right]\frac{2\lambda}{(1-\lambda)}\right]\Delta x(s) = \frac{F_{Lorentz}(s)}{k}; \quad (45)$$

Collecting real and imaginary terms in equation 45 as follows:

$$A(r) = \left(1 - r^2 - \left[\frac{1}{1+r^2\mu^2}\right]\frac{2\lambda}{(1-\lambda)}\right); \quad (46)$$

$$B(r) = \varsigma + \left(\frac{\mu}{1+r^2\mu^2}\right)\left(\frac{\lambda}{(1-\lambda)}\right); \quad (47)$$

this model can rewrite equation 45 as:

$$[A(r) + 2jr(B(r))]\Delta x(s) = \frac{F_{Lorentz}(s)}{k}; \quad (48)$$

The condition for resonance is:

$$r = r^* @ A(r^*) = 0 \quad (49)$$

Setting $A(r^*)=0$ in (A23a) and solving for $r^*$ this model produces the following result:

$$(r^*)^2 = \frac{(\mu^2-1) + \sqrt{(\mu^2-1)^2 + 4\mu^2\left(1-\frac{2\lambda}{(1-\lambda)}\right)}}{2\mu^2} \quad (50)$$

For small $\lambda$ and $\lambda\mu$, $r^*$ approximately satisfies:

$$r^* \cong \sqrt{1 - \frac{2\lambda}{(1-\lambda)(1+\mu^2)}} \quad (51)$$

For small $\lambda$ and $\mu$, $f^*$ approximately satisfies:

$$f^* \cong f_0(1-\lambda) \quad (52)$$

The damping term $\zeta^*$ at resonance is given by:

$$\zeta^* = r^* B(r^*) \quad (53)$$

The loaded $Q^*$ factor satisfies:

$$Q^* = \frac{1}{2\varsigma^*} = \frac{1}{2r^* B(r^*)} \quad (54)$$

The bandwidth satisfies:

$$BW = \frac{f^*}{Q^*} = f^* 2\varsigma^* = r^* f_0 2 r^* B(r^*) \quad (55)$$

For small $\lambda$ and $\mu$, the bandwidth approximately satisfies:

$$BW \cong BW_0 + 2\lambda\mu f_0 \quad (56)$$

EXAMPLE 2

Figure 8:
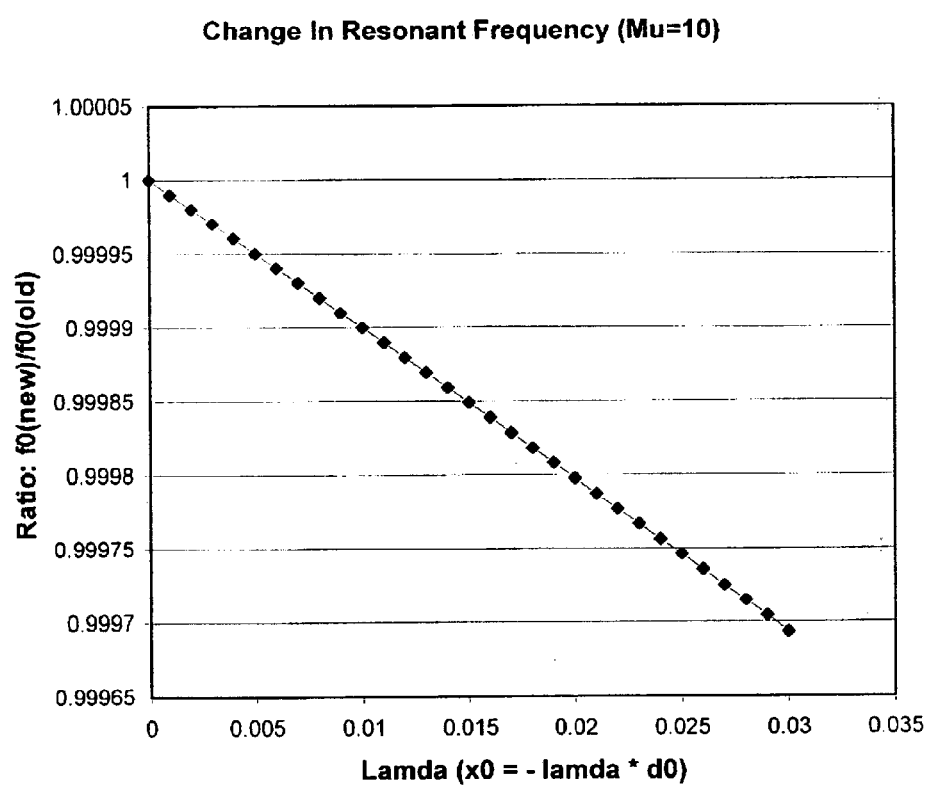
FIG. 8 is a graph of the relationship between BW and $\lambda$ for a vibratory device constructed in accordance with an embodiment of the present invention.
Figure 9:
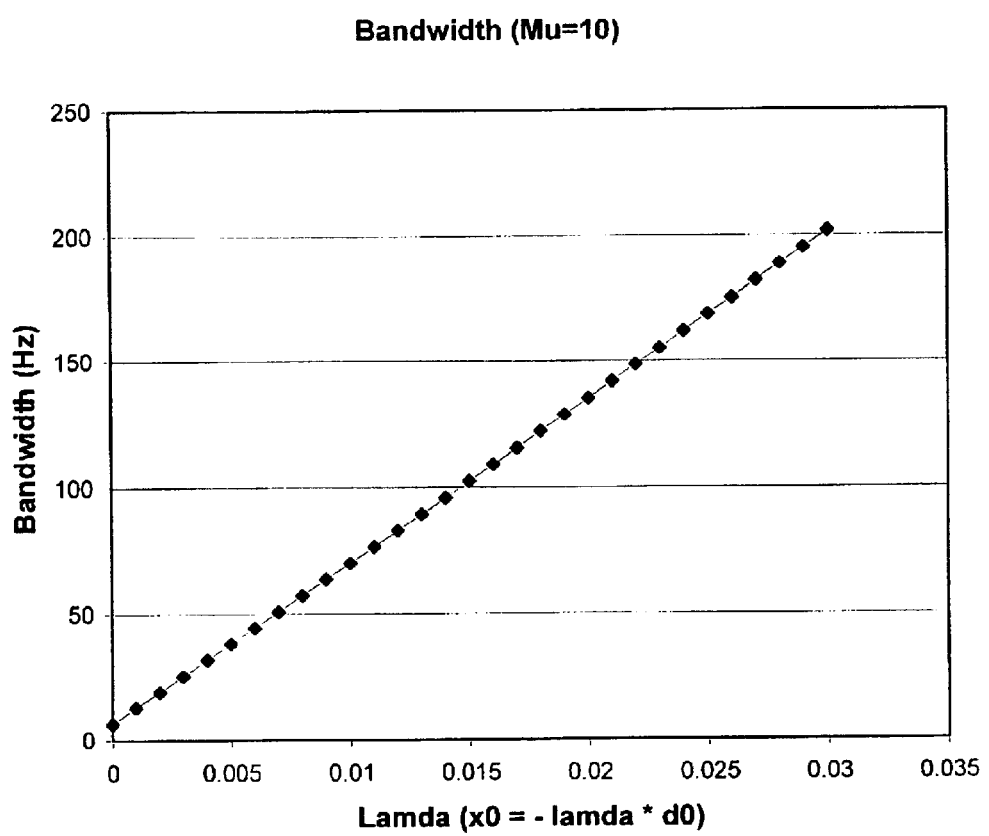
FIG. 9 is a graph of the relationship between a change in resonant frequent and $\lambda$ for a vibratory device constructed in accordance with an embodiment of the present invention.

Using the parameters set forth above in Tables 1 and 2, with one exception, the following tuning trends for BW and f* are given in FIGS. 5, & 8–9. The exception in Table 2 is that value of $R_L$ in equation 2 is defined so that $\mu=10$ which implies that $R_L$ is 100 times higher in this example.

FIG. 5 is a graph of the relationship between $V_0$ and $\lambda$ for a vibratory device constructed in accordance with an embodiment of the present invention.

FIG. 8 is a graph of the relationship between BW and $\lambda$ for a vibratory device constructed in accordance with an embodiment of the present invention. The bandwidth BW increases up to 30 times for small values of $\lambda(\mu=10)$.

FIG. 9 is a graph of the relationship between a change in resonant frequent and $\lambda$ for a vibratory device constructed in accordance with an embodiment of the present invention. The resonant frequency f* decreases only up to 0.03% for small values of $\lambda(\mu=10)$.

For values of $\mu$ much larger than 1.0 there is a much smaller decrease in resonant frequency f*. For example, for $\mu=10$ the resonant frequency f* decreases by only 0.03% and not by 3% as before. That is an improvement by a factor of 100. In addition at the same time, a benefit of the method of the present invention is to achieve the same effect on bandwidth as before in Example 1.

EXAMPLE 3

For the purpose of improving the capability to tune the resonant frequency of a micro-mechanical resonator, this example adds a self-inductance element L to a vibratory device of the present invention having a capacitor-based circuit with load resistor $R_L$ and voltage source $V_0$. The tuning is described in terms of three non-dimensional parameters $\mu$, $\gamma$, and $\delta$ that depend on $R_L$, L, and $V_0$. Using the values of the parameters as set forth in Tables 3 and 4, the following tuning trends for BW and f* are presented in FIGS. 10–14. The value of $R_L$ in equation 57 is defined so that $\mu=0.1$.

$$\mu = \frac{\omega_0 c_0 R_L}{(1-\lambda)} \qquad (57)$$

The value L of in equation 58 is defined so that $\delta$ varies in the range $-0.1 \leq \delta \leq +0.1$.

$$\gamma = 1 + \delta = \frac{\omega_0 c_0 (L\omega_0)}{(1-\lambda)} \qquad (58)$$

The voltage source $V_0$ is determined so that $0 \leq \lambda \leq 0.001$, as shown in equation 59.

$$V_0^2 = \lambda(1-\lambda)^2 \frac{2k d_0^2}{c_0} \qquad (59)$$

TABLE 3

Micro-Mechanical Beam System

| Description of Parameters | Values of the Parameters |
|---|---|
| Length of Beam | L = 450 microns |
| Width of Beam | b = 40 microns |
| Thickness of Beam | h = 2 microns |
| Density of Polysilicon Material | $\rho$ = 2.33e + 03 Kg/m$^3$ |
| Volume of Beam | Lbh = 3.6e − 14 m$^3$ |
| Mass of Beam | m = 8.388e − 11 Kg |
| Young's Modulus | E = 1.60e + 11 Newtons/m$^2$ |
| Beam Elastic "spring" Constant | k = 3.37 Newtons/m |
| Beam $\sqrt{k/m}$ Constant | $\omega_0$ = $\sqrt{k/m}$ = 200,476 rad/sec |
| Resonant Frequency of Beam | $f_0$ = $\omega_0/2\pi$ = 31,906.8 Hz |
| Mechanical Damping Constant | $\zeta$ = 0.0001 |

TABLE 4

Capacitor-Based Circuit

| Description of Parameters | Values of the Parameters |
|---|---|
| Capacitor Area (200 microns × 40 microns) | A = 8.0e − 09 m$^2$ |
| Permittivity of Free Space | $\epsilon_0$ = 8.854e − 12 farad/m |
| Distance Between Parallel-Plate Condenser | $d_0$ = 2 microns |
| Capacitance for Parallel-Plates @ $d_0$ | $c_0 = \epsilon_0 A/d_0$ = 3.54e − 14 farad |
| Load Resistor for Capacitor-Based Circuit | $R_L$(selected − values − in − ohms), based on value of $\mu$. |
| Self-Inductance for Capacitor-Based Circuit | L(selected − values − in − Henry(s)), based on value of $\gamma$. |
| Non-dimensional Parameter- $\lambda$ (Based on Coupled System) | $V_0^2 = \lambda(1-\lambda)^2 \frac{2kd_0^2}{c_0}$, $0 \leq \lambda \leq 0.01$ |
| Non-dimensional Parameter- $\mu$ (Based on Coupled System) | $\mu = \frac{\omega_0 c_0 R_L}{(1-\lambda)}$, set to 0.1 |

TABLE 4-continued

Capacitor-Based Circuit

| Description of Parameters | Values of the Parameters |
|---|---|
| Non-dimensional Parameter- $\gamma$ (or $\delta$) (Based on Coupled System) | $\gamma = 1 + \delta = \frac{\omega_0 c_0 (L\omega_0)}{(1-\lambda)}$, $-0.1 \leq \delta \leq +0.1$ |

Figure 10:
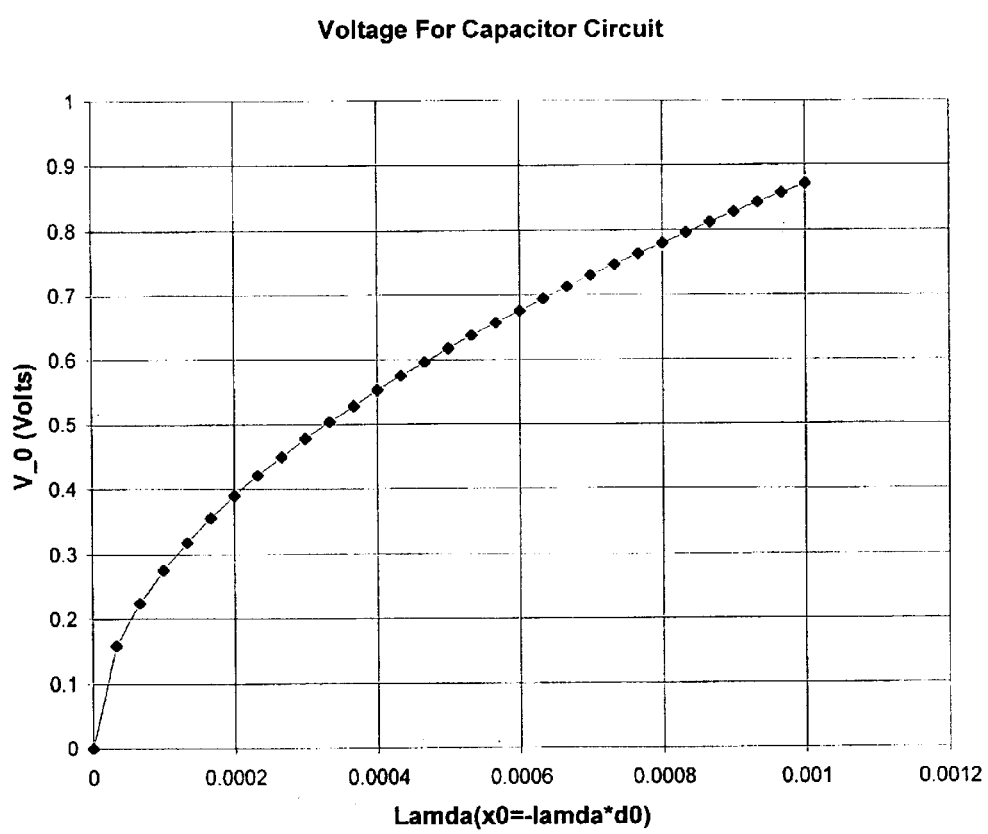
FIG. 10 is a graph of the relationship between $V_0$ and $\lambda$ for a vibratory device constructed in accordance with an embodiment of the present invention.

FIG. 10 is a graph of the relationship between $V_0$ and $\lambda$ for a vibratory device constructed in accordance with an embodiment of the present invention.

Figure 11:
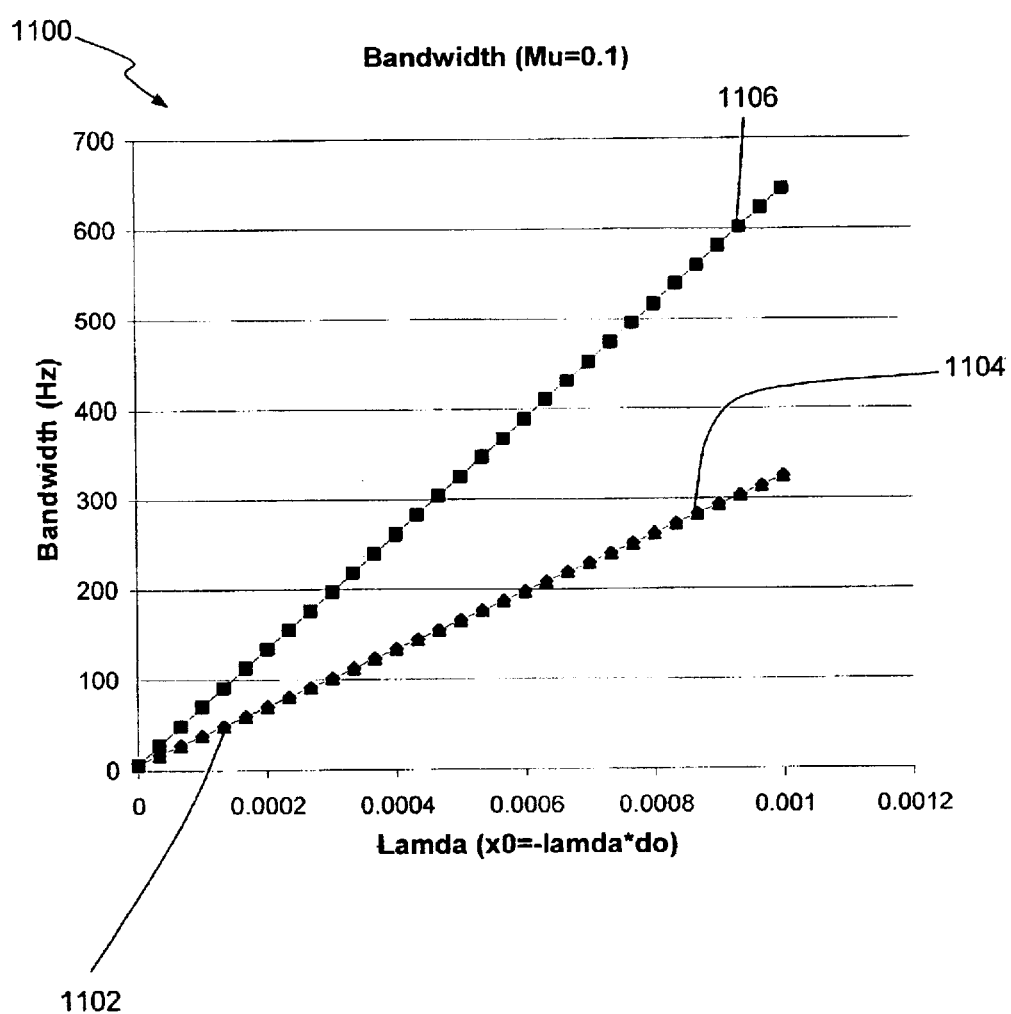
FIG. 11 is a graph of the relationship between BW and $\lambda$ for a vibratory device constructed in accordance with an embodiment of the present invention.

FIG. 11 is a graph of the relationship between BW and $\lambda$ for a vibratory device constructed in accordance with an embodiment of the present invention. The bandwidth BW increases up to 50 times for small values of $\lambda$ ($\mu=0.1$). In FIG. 11, a graph 1100 shows line 1102, line 1104, line 1106. Line 1102 is changed in bandwidth when $\delta$ is +0.10. Line 1104 is changed in bandwidth when $\delta$ is −0.10. Line 1106 is changed in bandwidth when $\delta$ is 0.

Figure 12:
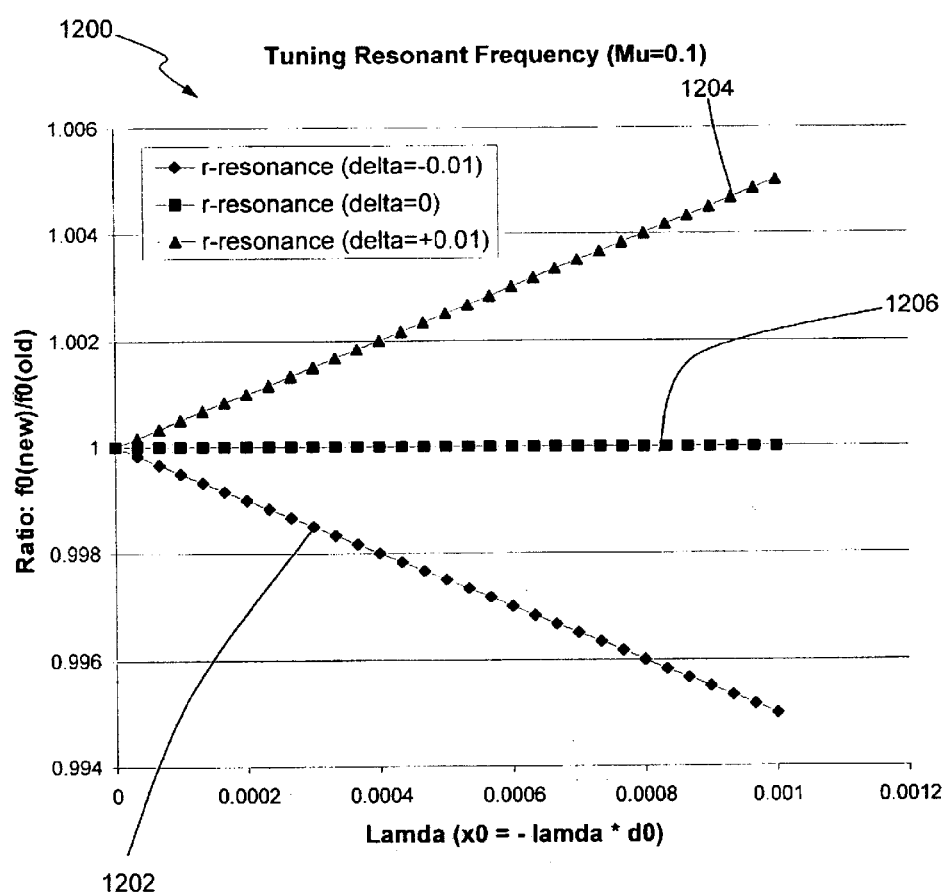
FIG. 12 is a graph of the relationship between a change in resonant frequent and $\lambda$ for a vibratory device constructed in accordance with an embodiment of the present invention.

FIG. 12 is a graph of the relationship between a change in resonant frequent and $\lambda$ for a vibratory device constructed in accordance with an embodiment of the present invention. In FIG. 12, a graph 1200 shows line 1202, line 1204, line 1206. Line 1202 is changed in bandwidth when $\delta$ is +0.10. Line 1204 is changed in bandwidth when $\delta$ is −0.10. Line 1206 is changed in bandwidth when $\delta$ is 0.

Figure 13:
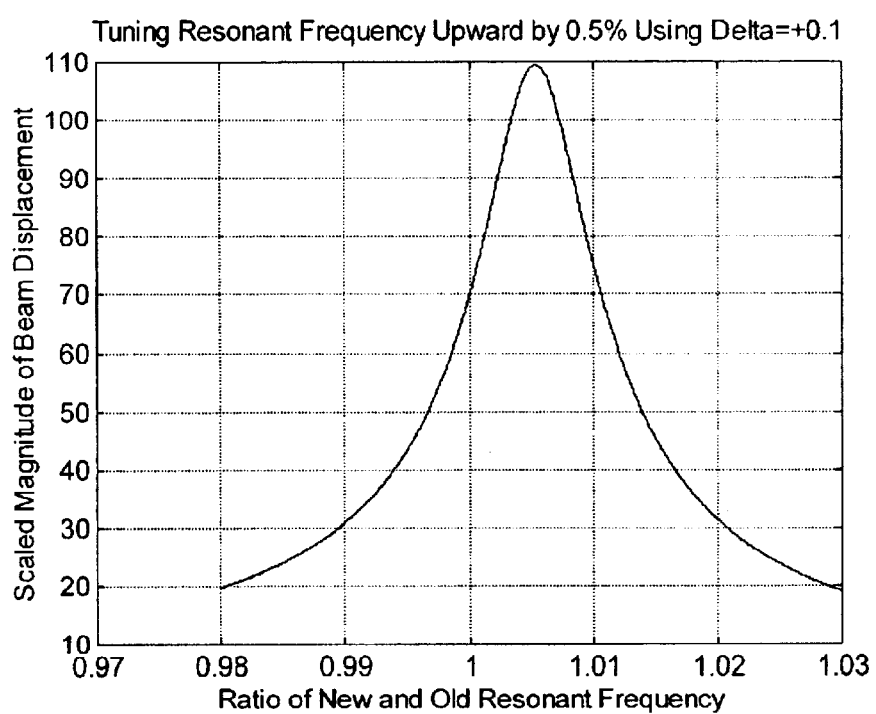
FIG. 13 is a graph of the relationship between the beam displacement and a change in resonant frequency, when tuned upward for a vibratory device constructed in accordance with an embodiment of the present invention.

FIG. 13 is a graph of the relationship between the beam displacement and a change in resonant frequency, when tuned upward for a vibratory device constructed in accordance with an embodiment of the present invention. Tuning resonant frequency shifted upward by 0.5%, using $\delta=+0.1$, $\mu=0.1$, and $\lambda=0.001$.

Figure 14:
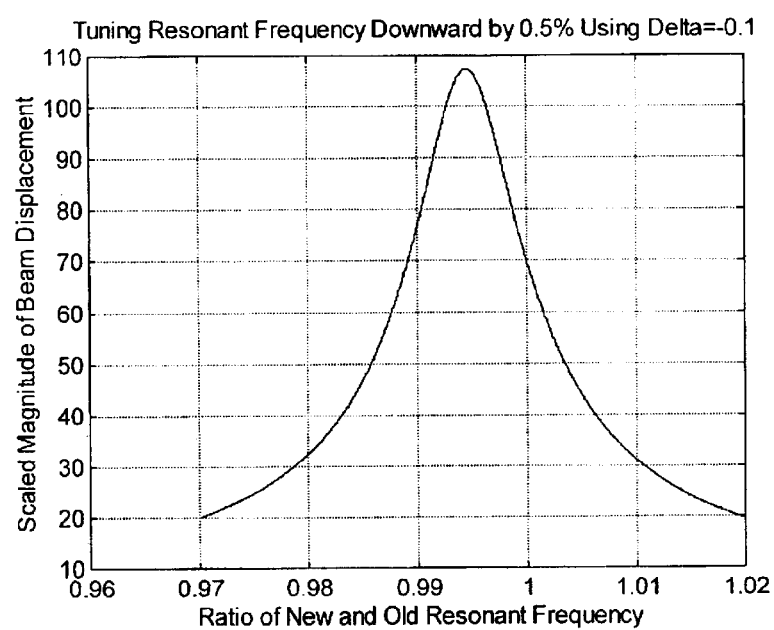
FIG. 14 is a graph of the relationship between the beam displacement and a change in resonant frequency, when tuned downward for a vibratory device constructed in accordance with an embodiment of the present invention.

FIG. 14 is a graph of the relationship between the beam displacement and a change in resonant frequency, when tuned downward for a vibratory device constructed in accordance with an embodiment of the present invention. Tuning resonant frequency shifted downward by 0.5%, using $\delta=-0.1$, $\mu=0.1$, and $\lambda=0.001$.

For sufficiently small values of the ratio $\lambda/\mu$ (i.e., $\lambda/\mu \leq 0.01$) and for $|\delta| \leq \mu$, the tuning trends satisfy the following approximations as shown in equation 60 and 61, respectively;

$$f^* \cong f_0 \left(1 + \frac{\lambda \delta}{(\delta^2 + \mu^2)}\right) \qquad (60)$$

$$BW \cong BW_0 + 2f_0 \frac{\lambda \mu}{(\delta^2 + \mu^2)} \qquad (61)$$

where $BW_0$ and $f_0$ are the bandwidth and resonant frequency, respectively, of a micro-mechanical resonator before a cantilevered resonator is coupled with a vibratory device having a capacitor-based circuit. In this example, below the range $\lambda \leq 0.001$ and $\mu=0.1$ increases the bandwidth by 50 times or more and the resonant frequency f* is tunable up or down by 150 Hz.

Model of Capacitor-Based Circuit with Self-Inductance L, Load Resistor $R_L$, and Voltage Source $V_0$ Model for capacitor C(x) is shown in equation 11. Voltage $V_c$ across capacitor is shown in equation 12. Force $F_c$ due to movable-plate capacitor (attractive force between plates) is shown in equation 14. Electrical energy E(x) is shown in equation 15.

Capacitor-Based Circuit with Load Resistor $R_L$ and Voltage Source $V_0$:

$$V_c + iR_L + L\frac{di}{dt} = V_0 \tag{62}$$

$$\frac{q}{C(x)} + R_L\frac{dq}{dt} + L\frac{d^2q}{dt^2} = V_0; \quad i = \frac{dq}{dt} \tag{63}$$

Equivalent mechanical resonator systems acted on by Lorentz force $F_{Lorentz}$ and "capacitance" force $F_c$ are shown in equations 17–20.

Coupled Mechanical Resonator/Capacitor-Based Circuit System acted on by Lorentz force $F_{Lorentz}$ are shown in equations 21, 22 and below:

$$\frac{q}{C(x)} + R_L\dot{q} + L\ddot{q} = V_0 \tag{64}$$

Equilibrium Point $(x_0, q_0)$ for Coupled Mechanical Resonator/Capacitor-Based Circuit: From equation 21 and equation 22, this model produces the equations for equilibrium as shown in equations 23–24.

This model defines $x_0$ in terms of $\lambda$ as shown in equation 25.

Solving equations 23 and 24 for $V_0$ in terms of $\lambda$, this model produces the results shown in equation 26.

From equation 26 the maximum value of $V_0^2$ is achieved when $\lambda=1/3$. Equilibrium is only achieved for $0 \leq \lambda \leq 1/3$, as shown in equation 27.

In terms of $\lambda$, $q_0$ is given by equation 28.

Linearized Equations of Motion about Equilibrium Point $(x_0, q_0)$ for Coupled Mechanical Resonator/Capacitor-Based Circuit:

This model defines linearized variables $\Delta x$ and $\Delta q$ as shown in equations 29 and 30.

Linearizing equation 21 and equation 64, this model produces equation 31 and the following equation, respectively:

$$(L\omega_0)\frac{\Delta\ddot{q}}{(\omega_0)^2} + R_L\frac{\Delta\dot{q}}{\omega_0} + \frac{(1-\lambda)}{\omega_0 c_0}\Delta q + \frac{q_0}{\omega_0 c_0 d_0}\Delta x = 0; \tag{65}$$

This models makes the following definitions:

$$\mu = \frac{\omega_0 c_0 R_L}{(1-\lambda)} \tag{66}$$

$$\gamma = \frac{\omega_0 c_0 (L\omega_0)}{(1-\lambda)} \tag{67}$$

and rewrites equation 31 and equation 65 as equation 33 and the following equation, respectively:

$$\gamma\frac{\Delta\ddot{q}}{(\omega_0)^2} + \mu\frac{\Delta\dot{q}}{\omega_0} + \Delta q + \frac{\sqrt{(2\lambda k c_0)}}{(1-\lambda)}\Delta x = 0; \tag{68}$$

Using Laplace Transforms, equation 33 and equation 68 can be rewritten as follows:

$$\left(\frac{s^2}{\omega_0^2} + 2\varsigma\frac{s}{\omega_0} + 1\right)\Delta x(s) + \frac{\sqrt{(2\lambda k c_0)}}{c_0 k}\Delta q(s) = \frac{F_{Lorentz}(s)}{k}; \tag{69}$$

$$\left(\gamma\frac{s^2}{(\omega_0)^2} + \mu\frac{s}{\omega_0} + 1\right)\frac{\sqrt{(2\lambda k c_0)}}{c_0 k}\Delta q(s) + \frac{2\lambda}{(1-\lambda)}\Delta x(s) = 0; \tag{70}$$

The substitution of equation 70 into equation 69 and produces the following results:

$$\left[\left(\frac{s^2}{\omega_0^2} + 2\varsigma\frac{s}{\omega_0} + 1\right) - \frac{2\lambda}{(1-\lambda)\left(\gamma\frac{s^2}{(\omega_0)^2} + \mu\frac{s}{\omega_0} + 1\right)}\right]\Delta x(s) = \frac{F_{Lorentz}(s)}{k}; \tag{71}$$

The substitution of equation 43 into equation 44 gives $$\left[1 - r^2 + 2\varsigma jr - \left[\frac{(1-\gamma r^2) - jr\mu}{(1-\gamma r^2)^2 + r^2\mu^2}\right]\frac{2\lambda}{(1-\lambda)}\right]\Delta x(s) = \frac{F_{Lorentz}(s)}{k}; \tag{72}$$

Collecting real and imaginary terms in equation 72 as follows:

$$A(r) = \left(1 - r^2 - \left[\frac{(1-\gamma r^2)}{(1-\gamma r^2)^2 + r^2\mu^2}\right]\frac{2\lambda}{(1-\lambda)}\right); \tag{73}$$

$$B(r) = \varsigma + \left[\frac{\mu}{(1-\gamma r^2)^2 + r^2\mu^2}\right]\left(\frac{\lambda}{(1-\lambda)}\right); \tag{74}$$

this model can rewrite equation 72 as equation 48.

The condition for resonance is shown in equation 49.

At resonant conditions this model produces the following approximation $r^* \cong 1$ for sufficiently small $\lambda$, sufficiently small values of the ratio $\lambda/\mu$ (say, $\lambda/\mu \leq 0.01$), and $|1-\gamma| \leq \mu$. In this case, $r^*$ approximately satisfies $$(r^*)^2 \cong 1 - 2\lambda\left[\frac{(1-\gamma)}{(1-\gamma)^2 + \mu^2}\right] \tag{75}$$

$$r^* \cong 1 - \lambda\left[\frac{(1-\gamma)}{(1-\gamma)^2 + \mu^2}\right] \tag{76}$$

Consequently, for sufficiently small $\mu$, sufficiently small values of the ratio $\lambda/\mu$ (say, $\lambda/\mu \leq 0.01$), and for $|1-\gamma| \leq \mu$, $f^*$ approximately satisfies $$f^* \cong f_0\left(1 - \lambda\left[\frac{(1-\gamma)}{(1-\gamma)^2 + \mu^2}\right]\right) \tag{77}$$

and the bandwidth BW approximately satisfies $$BW \cong BW_0 + 2f_0\left[\frac{\lambda\mu}{(1-\gamma)^2 + \mu^2}\right] \tag{78}$$

where $BW_0$ and $f_0$ are the bandwidth and resonant frequency, respectively, of the micro-mechanical resonator before it is coupled with the capacitor-based circuit.

By defining the small parameter $\delta$ through the equation $$\gamma = 1 + \delta \tag{79}$$

rewriting equation 77 and equation 78 as $$f^* \cong f_0\left(1 + \frac{\lambda\delta}{(\delta^2 + \mu^2)}\right) \quad (80)$$

$$BW \cong BW_0 + 2f_0\frac{\lambda\mu}{(\delta^2 + \mu^2)} \quad (81)$$

EXAMPLE 4

For the purposes of this example the Adffpw1144 (Amorphous Diamond Fundamental Mode Flexural Plate Wave with membrane diameter 1144 microns) data was fit in a least squares sense using the model given below. Since the data was non-symmetrical about the resonant frequency, the model was applied separately to both sides with continuity imposed at the resonant frequency. The fit of the model with the data is shown in FIGS. 16A through 16G.

As shown in Table 5, the bandwidth increased from 2.9 Hz to 9.5 Hz as $R_L$ decreased from infinity to 10.7 ohms. The effective Q decreased from 18.8K to 5.6K.

TABLE 5

Increase of Bandwidth using Parallel Resistor $R_L$

| Parallel Resistor $R_L$ (Ohms) | BW @-3 db (Hz) | BW @-6 db (Hz) | $Q_{Effective}$ (@-3 db) | Ratio of BW BW with $R_L$ / BW without $R_L$ |
|---|---|---|---|---|
| 10.7 | 9.5 | 16.5 | 5.6K | 3.28 |
| 14.8 | 7.2 | 12.5 | 7.5K | 2.48 |
| 30.1 | 5.5 | 9.5 | 9.8K | 1.90 |
| 49.8 | 4.8 | 8.4 | 11.1K | 1.66 |
| 79.9 | 4.4 | 7.6 | 12.3K | 1.52 |
| 94.7 | 4.3 | 7.4 | 12.6K | 1.48 |
| $R_L = \infty$ | 2.9 | 5.0 | 18.8K | 1.0 |

Figure 15:
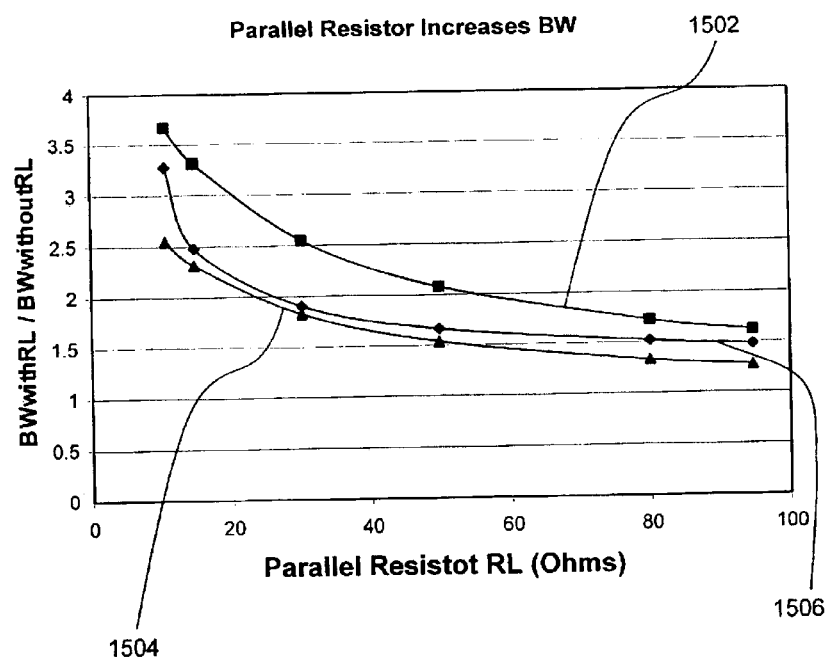
FIG. 15 is a graph of the experimental results that are associated with increasing the bandwidth using a parallel resistor are compared with the theoretical results.

FIG. 15 is a graph of the experimental results that are associated with increasing the bandwidth using a parallel resistor are compared with the theoretical results. The fit of the model is shown in FIGS. 16A through 16G, where the parameter $R_1 K_1^2/R_{beam}$ ranged from 5.0 to 7.5 and the parameter $R_{beam}$ ranged from 10.6 to 12.6. In FIG. 15, top curve 1502 is based on the maximum values $K_1^2 R_1/R_{beam}=7.5$ and $R_{beam}=12.6$. Bottom curve 1504 is based on the minimum values $K_1^2 R_1/R_{beam}=5.0$ and $R_{beam}=10.6$. Middle curve 1506 is based on the theoretical results.

Figure 16A:
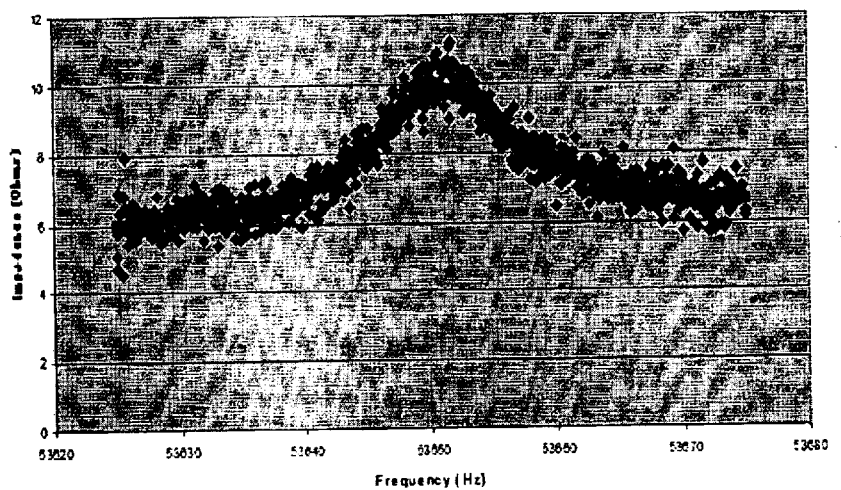
FIG. 16A is a graph of resistance vs. frequency for a vibratory device constructed in accordance with an embodiment of the present invention employing a 10.7 Ohm load resistor.

FIG. 16A is a graph of resistance vs. frequency for a vibratory device constructed in accordance with an embodiment of the present invention employing a 10.7 Ohm load resistor.

Figure 16B:
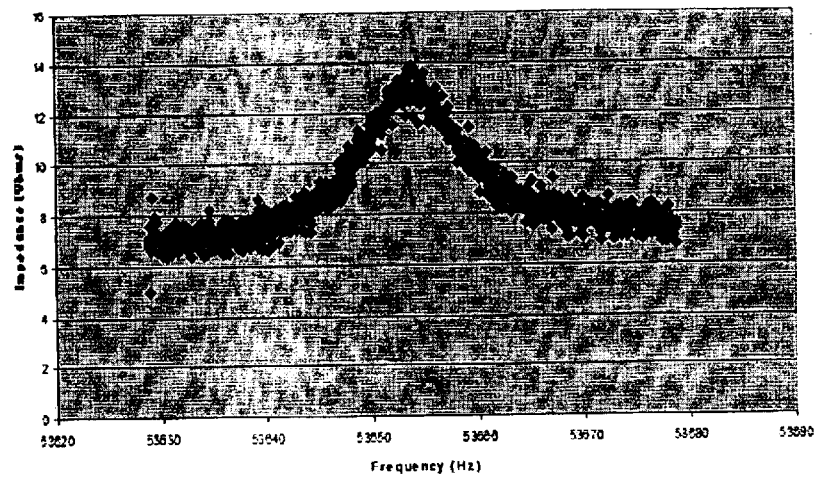
FIG. 16B is a graph of resistance vs. frequency for a vibratory device constructed in accordance with an embodiment of the present invention employing a 14.8 Ohm load resistor.

FIG. 16B is a graph of resistance vs. frequency for a vibratory device constructed in accordance with an embodiment of the present invention employing a 14.8 Ohm load resistor.

Figure 16C:
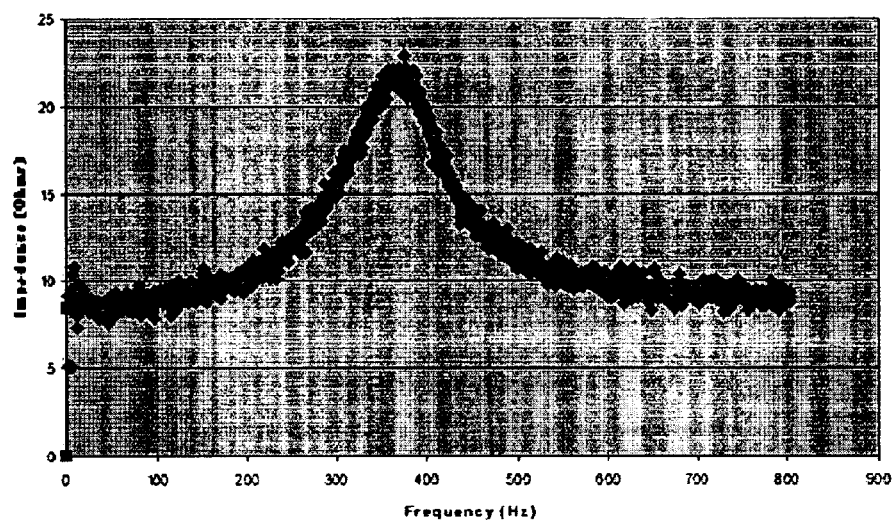
FIG. 16C is a graph of resistance vs. frequency for a vibratory device constructed in accordance with an embodiment of the present invention employing a 30.1 Ohm load resistor.

FIG. 16C is a graph of resistance vs. frequency for a vibratory device constructed in accordance with an embodiment of the present invention employing a 30.1 Ohm load resistor.

Figure 16D:
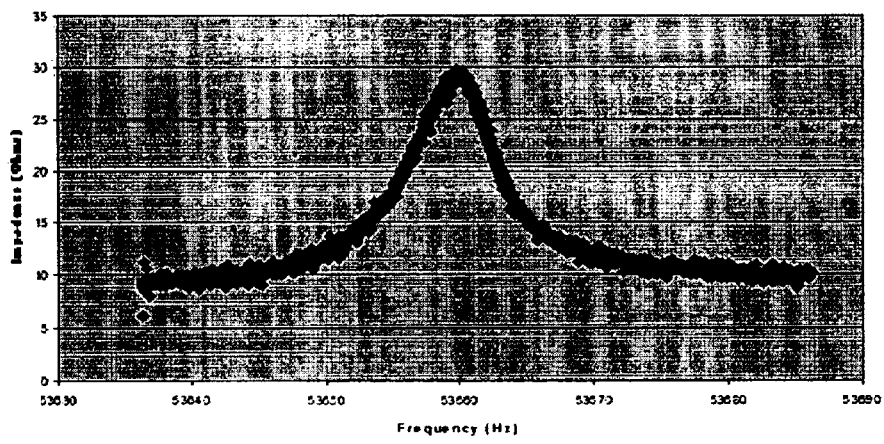
FIG. 16D is a graph of resistance vs. frequency for a vibratory device constructed in accordance with an embodiment of the present invention employing a 49.8 Ohm load resistor.

FIG. 16D is a graph of resistance vs. frequency for a vibratory device constructed in accordance with an embodiment of the present invention employing a 49.8 Ohm load resistor.

Figure 16E:
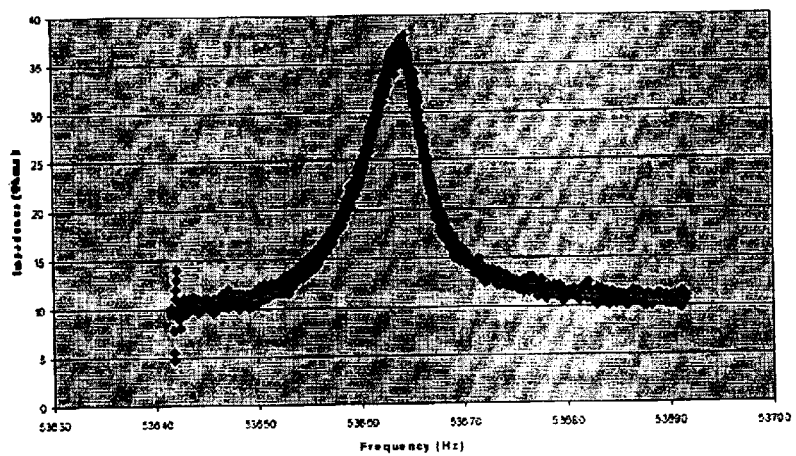
FIG. 16E is a graph of resistance vs. frequency for a vibratory device constructed in accordance with an embodiment of the present invention employing a 79.9 Ohm load resistor.

FIG. 16E is a graph of resistance vs. frequency for a vibratory device constructed in accordance with an embodiment of the present invention employing a 79.9 Ohm load resistor.

Figure 16F:
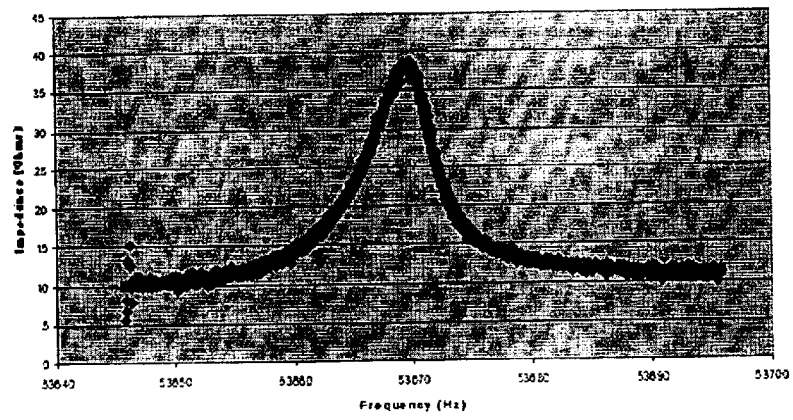
FIG. 16F is a graph of resistance vs. frequency for a vibratory device constructed in accordance with an embodiment of the present invention employing a 94.7 Ohm load resistor.

FIG. 16F is a graph of resistance vs. frequency for a vibratory device constructed in accordance with an embodiment of the present invention employing a 94.7 Ohm load resistor.

Figure 16G:
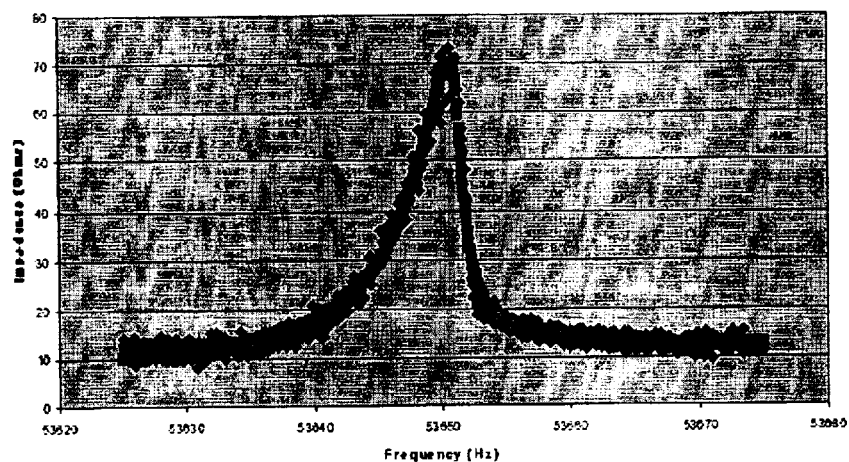
FIG. 16G is a graph of resistance vs. frequency for a vibratory device constructed in accordance with an embodiment of the present invention employing an infinity ($\infty$) Ohm load resistor.

FIG. 16G is a graph of resistance vs. frequency for a vibratory device constructed in accordance with an embodiment of the present invention employing a ∞ Ohm load resistor.

Input Impedance Model for Bandwidth Tuning with parallel resistor $R_L$

Figure 17:
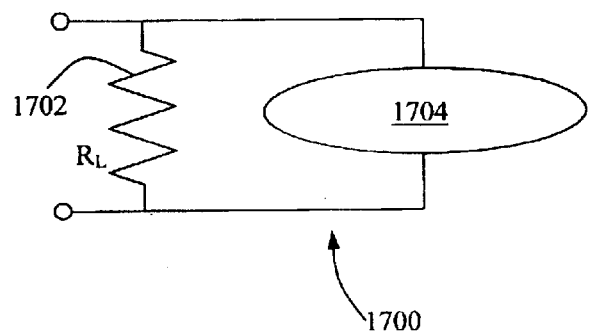
FIG. 17 illustrates a resistor $R_L$ in parallel with a flexural plate wave (FPW) device constructed in accordance with an embodiment of the present invention.

The following equations are based on adding a resistor $R_L$ in parallel with the flexural plate wave (FPW) device, as shown in FIG. 17 to increase bandwidth of that given by the model published in S. J. Martin, M. A. Butler, J. J. Spates, M. A. Mitchell, and W. K. Schubert, *"Flexural plate wave resonator excited with Lorentz forces,"* J. Applied Physics, 83, 9, (1 May 1998), the entire contents and disclosures of which are hereby incorporated by reference. FIG. 17, shows a vibratory device 1700 has a load resistor 1702 connected in parallel with a flexural device 1704. The equations below are a function of the frequency ratio $r=f/f_0$ and the parameters $K_1^2 R_1$, $R_{beam}$, $R_L$, and $Q_{mech}$. $R_{beam}$ is the series resistor, $R_L$ is the parallel resistor, and $Q_{mech}$ is the mechanical Q. The quantities $K_1^2$ and $R_1$ are defined by Eqs. (15) and (19d) in the above reference. Only the product $K_1^2 R_1$ is needed below. This model uses the quantity $R_{beam}$ to denote the series resistor $R_{01}$ of Eq. (17) in the above reference.

The input impedance magnitude $|Z_{11}(r)|$ satisfies $$|Z_{11}(r)| = \frac{R_L R_{beam}}{R_L + R_{beam}} \sqrt{\left[\frac{\mu^2(r) + X^2(r)g^2(r)}{1 + X^2(r)g^2(r)}\right]} \quad (82)$$

where $$r = \frac{f}{f_0} = \frac{\omega}{\omega_0} \quad (83)$$

$$X(r) = Q_{mech}(r^2 - 1) \quad (84)$$

$$\mu(r) = \left[\frac{1 + r\frac{K_1^2 R_1}{R_{beam}}}{1 + r\frac{K_1^2 R_1}{(R_L + R_{beam})}}\right] \quad (85)$$

$$g(r) = \left[\frac{1}{1 + r\frac{K_1^2 R_1}{(R_L + R_{beam})}}\right] \quad (86)$$

At r=1, μ(r=1) satisfies $$\mu_1 = \mu(r = 1) = \frac{(Z_{11})_{peak}}{(Z_{11})_{min}} = \left[\frac{1 + \frac{K_1^2 R_1}{R_{beam}}}{1 + \frac{K_1^2 R_1}{(R_L + R_{beam})}}\right] \quad (87)$$

The minimum and maximum magnitudes of $Z_{11}(r)$ satisfy $$|Z_{11}|_{min} = \frac{R_L R_{beam}}{R_L + R_{beam}} \quad (88)$$

$$|Z_{11}|_{peak} = \frac{R_L R_{beam}}{R_L + R_{beam}} \left[ \frac{1 + \frac{K_1^2 R_1}{R_{beam}}}{1 + \frac{K_1^2 R_1}{(R_L + R_{beam})}} \right] \quad (89)$$

The BW satisfies the approximation:

$$\Delta f(BW@-3db) \cong \frac{f_0}{Q_{Loaded}} \quad (90)$$

$$\Delta f(BW@-6db) \cong \sqrt{3} \frac{f_0}{Q_{Loaded}} \quad (91)$$

where $Q_{Loaded}$ is the loaded Q due to the presence of the resistors $R_{beam}$ and $R_L$:

$$Q_{Loaded} = \frac{Q_{mech}}{\left[1 + \frac{R_1 K_1^2}{R_L + R_{beam}}\right] \sqrt{\frac{1 + \left(\frac{4}{2+\sqrt{2}}\right)\left(\frac{R_{beam}}{R_1 K_1^2}\right)\left(1 + \frac{R_{beam} + R_1 K_1^2}{R_L}\right)}{1 + \left(\frac{4}{\sqrt{2}}\right)\left(\frac{R_{beam}}{R_1 K_1^2}\right)\left(1 + \frac{R_{beam} + R_1 K_1^2}{R_L}\right)}}} \quad (93)$$

Note that the loaded Q reduces to $Q_{mech}$ when $R_{beam}=0$ and $R_L=\infty$.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method for tuning a vibratory device including a cantilevered resonator comprising the steps of:

increasing a voltage $V_0$ supplied to said vibratory device to thereby increase the bandwidth of said vibratory device; and keeping the resonant frequency of said vibratory device at substantially the natural frequency of said cantilevered resonator, wherein said vibratory device comprises:
  a capacitor including a movable plate and a fixed plate spaced from each other, said movable plate being part of said cantilevered resonator;
  a voltage source connected to said capacitor for providing said voltage $V_0$ across said capacitor to produce an attractive force between said movable plate and said fixed plate;
  a circuit connecting said voltage source to said capacitor; and
  a load resistor in said circuit having a resistance $R_L$ satisfying the following equation:

$$\mu = \frac{\omega_0 c_0 R_L}{(1-\lambda)}$$

where
  $\mu$ is at least 10;
  $\omega_0$ is the beam constant for said cantilevered resonator;
  $c_0$ is the capacitance for said capacitor; and
  $\lambda$ is the voltage dependent coupling parameter for said voltage $V_0$.

2. The method of claim 1, wherein the tuning of said vibratory device is actively tuned.

3. The method of claim 1, wherein said vibratory device is part of an array.

4. The method of claim 1, wherein said vibratory device is a MEMS resonator.

5. The method of claim 1, wherein said bandwidth and said resonant frequency are independently tuned.

6. The method of claim 5, wherein said resonant frequency is independently tuned up to match a chosen frequency.

7. The method of claim 5, wherein said resonant frequency is independently tuned down to match a chosen frequency.

8. The method of claim 1, further comprising the step of decreasing said voltage $V_0$ to thereby increase the bandwidth of said vibratory device.

9. A method for tuning a vibratory device including a cantilevered resonator comprising the steps of:

increasing a voltage $V_0$ supplied to said vibratory device to thereby increase the bandwidth of said vibratory device; and simultaneously decreasing the resonant frequency of said vibratory device below the natural frequency of said cantilevered resonator, wherein said vibratory device comprises:
  a capacitor including a movable plate and a fixed plate spaced from each other, said movable plate being part of said cantilevered resonator;
  a voltage source connected to said capacitor for providing said voltage $V_0$ across said capacitor to produce an attractive force between said movable plate and said fixed plate;
  a circuit connecting said voltage source to said capacitor; and
  a load resistor in said circuit having a resistance $R_L$ satisfying the following equation:

$$\mu = \frac{\omega_0 c_0 R_L}{(1-\lambda)}$$

where
  $\mu$ is no more than 0.1;
  $\omega_0$ is the beam constant for said cantilevered resonator;
  $c_0$ is the capacitance for said capacitor; and
  $\lambda$ is the voltage dependent coupling parameter for said voltage $V_0$.

10. The method of claim 9, wherein the tuning of said vibratory device is actively tuned.

11. The method of claim 9, wherein said vibratory device is part of an array.

12. The method of claim 9, wherein said vibratory device is a MEMS resonator.

13. The method of claim 9, wherein said bandwidth and said resonant frequency are independently tuned.

14. The method of claim 13, wherein said resonant frequency is independently tuned up to match a chosen frequency.

15. The method of claim 13, wherein said resonant frequency is independently tuned down to match a chosen frequency.

16. The method of claim 9, further comprising the step of decreasing said voltage $V_0$ to thereby increase the bandwidth of said vibratory device.

17. A method for tuning a vibratory device including a cantilevered resonator comprising the steps of:
increasing a voltage $V_0$ supplied to said vibratory device to thereby increase the bandwidth of the vibratory device; and
varying the resonant frequency of said vibratory device by adjusting the self-inductance L of an inducer of said vibratory device, wherein said vibratory device comprises:
a capacitor including a movable plate and a fixed plate spaced from each other, said movable plate being part of said cantilevered resonator;
a voltage source connected to said capacitor for providing said voltage $V_0$ across said capacitor to produce an attractive force between said movable plate and said fixed plate;
a circuit connecting said voltage source to said capacitor, said circuit including said inducer; and
a load resistor in said circuit having a resistance $R_L$ satisfying the following equation:

$$\mu = \frac{\omega_0 c_0 R_L}{(1-\lambda)}$$

where
$\mu$ is no more than 0.1;
$\omega_0$ is the beam constant for said cantilevered resonator;
$c_0$ is the capacitance for said capacitor; and
$\lambda$ is the voltage dependent coupling parameter for said voltage $V_0$.

18. The method of claim 17, wherein said self-inductance L of said inducer satisfies the equation:

$$\delta = \frac{\omega_0 c_0 (L\omega_0)}{(1-\lambda)} - 1$$

wherein $|\delta|$ is less than $\mu$.

19. The method of claim 17, wherein the tuning of said vibratory device is actively tuned.

20. The method of claim 17, wherein said vibratory device is part of an array.

21. The method of claim 17, wherein said vibratory device is a MEMS resonator.

22. The method of claim 17, wherein said bandwidth and said resonant frequency are independently tuned.

23. The method of claim 22, wherein said resonant frequency is independently tuned up to match a chosen frequency.

24. The method of claim 22, wherein said resonant frequency is independently tuned down to match a chosen frequency.

25. The method of claim 17, further comprising the step of decreasing said voltage $V_0$ to thereby increase the bandwidth of said vibratory device.

* * * * *